US012364123B2

(12) United States Patent
Zhang

(10) Patent No.: US 12,364,123 B2
(45) Date of Patent: Jul. 15, 2025

(54) DISPLAY PANEL AND DISPLAY DEVICE

(71) Applicant: Wuhan Tianma Microelectronics Co., Ltd., Wuhan (CN)

(72) Inventor: Dian Zhang, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 0 days.

(21) Appl. No.: 18/416,321

(22) Filed: Jan. 18, 2024

(65) Prior Publication Data

US 2024/0164161 A1 May 16, 2024

(30) Foreign Application Priority Data

Aug. 24, 2023 (CN) .......................... 202311076645.9

(51) Int. Cl.
*G09G 3/3233* (2016.01)
*G09G 3/3225* (2016.01)
*H10K 59/131* (2023.01)

(52) U.S. Cl.
CPC ......... *H10K 59/131* (2023.02); *G09G 3/3225* (2013.01); *G09G 2300/0842* (2013.01); *G09G 2300/0861* (2013.01); *G09G 2310/08* (2013.01)

(58) Field of Classification Search
None
See application file for complete search history.

(56) References Cited

U.S. PATENT DOCUMENTS

2022/0199024 A1* 6/2022 Zhang .................. G09G 3/3233
2023/0075463 A1* 3/2023 Lee ....................... G09G 3/3233

FOREIGN PATENT DOCUMENTS

CN           115398639 A      11/2022

* cited by examiner

*Primary Examiner* — Carl Adams
(74) *Attorney, Agent, or Firm* — KDW FIRM PLLC

(57) ABSTRACT

A display panel includes a plurality of pixel circuits, a plurality of signal write control lines, a plurality of reset control lines, a plurality of data lines, and a plurality of connection wires; the connection wire includes a first connection wire segment and a second connection wire segment; and a reset control signal provided for the (N+i+1)-th row of pixel circuits is an (N+i+1)-th reset control signal, and a write control signal provided for the N-th row of pixel circuits is an N-th write control signal, where a first voltage edge and/or a second voltage edge of an enable level of the (N+i+1)-th reset control signal do not overlap an enable level of the N-th write control signal; and in an enable level of the same reset control signal, the second voltage edge is after the first voltage edge, N is a positive integer, and i is a natural number.

20 Claims, 24 Drawing Sheets

DISPLAY PANEL AND DISPLAY DEVICE

CROSS-REFERENCE TO RELATED APPLICATION

This application claims priority to Chinese Patent Application No. 202311076645.9, filed on Aug. 24, 2023, the disclosure of which is incorporated herein by reference in its entirety.

TECHNICAL FIELD

The present disclosure relates to the field of display technology and, in particular, to a display panel and a display device.

BACKGROUND

With the development of display technology, liquid crystal display (LCD) panels and organic light-emitting diode (OLED) display panels have gradually become two mainstream display panels in the display field. The LCD panels and the OLED display panels are widely used in a device (including a display device) or scenario where a display function can be integrated and which are known to those skilled in the art, such as a computer, a mobile phone, a wearable device, and a vehicle.

The display panel in the related art includes a display region and a non-display region, where the display region includes a plurality of scan lines, a plurality of data lines, and a plurality of pixel circuits, and data signals of the data lines are written into the pixel circuits under the control of scan signals of the scan lines so that pixels where the pixel circuits are located are controlled to perform image display; and the non-display region includes a fan-out region including fan-out wires, and connection wires connecting data lines to fan-out wires are provided in the display region of the display panel, so as to achieve the design of a narrow bezel.

SUMMARY

The present disclosure provides a display panel and a display device, so as to reduce an effect of coupling between signal lines on data signals and improve a display effect of a display panel.

According to one aspect of the present disclosure, a display panel is provided. The display panel includes a display region including a plurality of pixel circuits, a plurality of signal write control lines, a plurality of reset control lines, a plurality of data lines, and a plurality of connection wires.

The plurality of pixel circuits are arranged in an array along a first direction and a second direction and arranged in rows along the first direction, each of the plurality of pixel circuits includes a drive transistor, a data write transistor, and a first reset transistor, a first terminal of the data write transistor is coupled to a first terminal of the drive transistor, and a first terminal of the first reset transistor is coupled to a gate of the drive transistor.

The plurality of signal write control lines and the plurality of reset control lines are arranged along the second direction, a signal write control line of the plurality of signal write control lines is coupled to a gate of the data write transistor, and a reset control line of the plurality of reset control lines is coupled to a gate of the first reset transistor.

The plurality of data lines are arranged along the first direction, and a data line of the plurality of data lines is coupled to a second terminal of the data write transistor.

Each of the plurality of connection wires includes a first connection wire segment extending along the first direction and a second connection wire segment extending along the second direction, and the first connection wire segment is electrically connected to the data line.

A reset control signal provided for the (N+i+1)-th row of pixel circuits is denoted as an (N+i+1)-th reset control signal, and a write control signal provided for the N-th row of pixel circuits is denoted as an N-th write control signal, where a first voltage edge of an enable level of the (N+i+1)-th reset control signal does not overlap an enable level of the N-th write control signal and/or a second voltage edge of an enable level of the (N+i+1)-th reset control signal does not overlap an enable level of the N-th write control signal.

In an enable level of the same reset control signal, the second voltage edge is after the first voltage edge, N is a positive integer, and i is a natural number.

According to another aspect of the present disclosure, a display device is provided. The display device includes the preceding display panel.

BRIEF DESCRIPTION OF DRAWINGS

To illustrate technical solutions in embodiments of the present disclosure more clearly, the drawings used in the description of the embodiments are briefly described below. Apparently, the drawings described below only illustrate part of the embodiments of the present disclosure, and those of ordinary skill in the art may obtain other drawings based on the drawings described below on the premise that no creative work is done.

DETAILED DESCRIPTION

Figure 1:
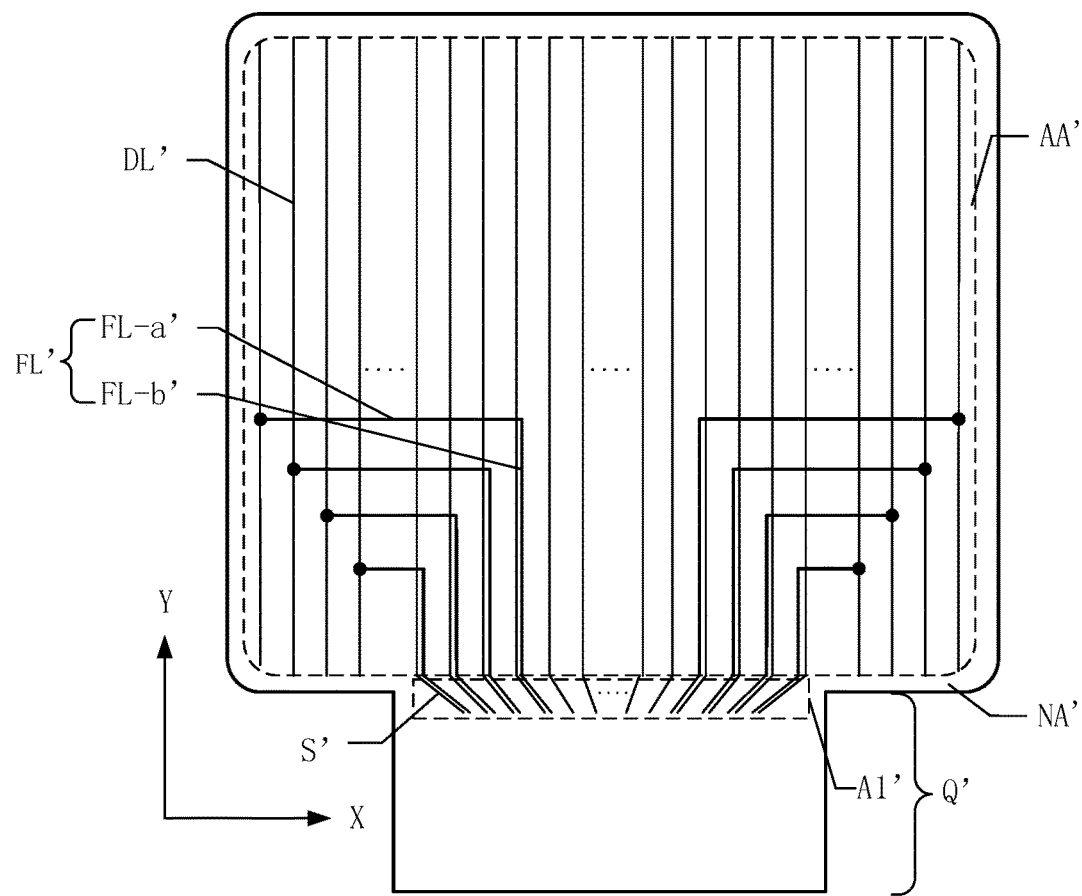
FIG. 1 is a top view of a display panel in the related art.

Hereinafter the present disclosure is further described in detail in conjunction with the drawings and embodiments. It is to be understood that the embodiments described herein are intended to illustrate the present disclosure and not to limit the present disclosure. Additionally, it is to be noted that for ease of description, only part, not all, of structures related to the present disclosure are illustrated in the drawings.

It is found through researches that connection wires provided in a display region may generate coupling with other signal lines in the display region. For example, coupling between scan lines and the connection wires occurs, resulting in abnormal data signals.

FIG. 1 is a top view of a display panel in the related art. Referring to FIG. 1, the display panel includes a display region AA' and a non-display region NA', where the non-display region NA' includes a fan-out region A1' including a plurality of fan-out wires S'. The display region AA' includes a plurality of data lines DL' extending along a second direction Y and arranged along a first direction X, where the first direction X intersects the second direction Y. The data lines DL' are electrically connected to the fan-out wires S'. Part of the data lines DL' are electrically connected to fan-out wires S' through connection wires FL'. Each connection wire FL' is disposed in the display region AA' and includes a first connection wire segment FL-a' extending along the first direction X and a second connection wire segment FL-b' extending along the second direction Y. The first connection wire segment FL-a' is electrically connected to a data line DL' in the display region AA', and the second connection wire segment FL-b' is electrically connected to a fan-out wire S'. The display panel 10' further includes a step region Q' where a control chip and the like are disposed.

Figure 2:
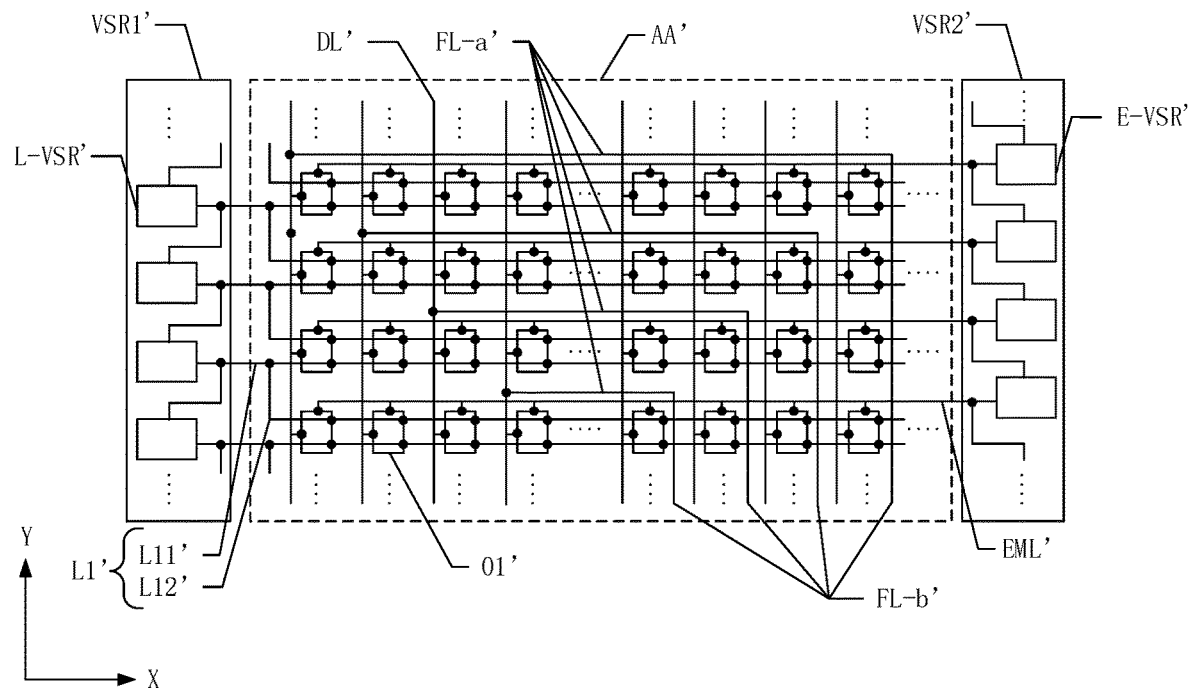
FIG. 2 is a partial structure diagram of the display panel of FIG. 1.
Figure 3:
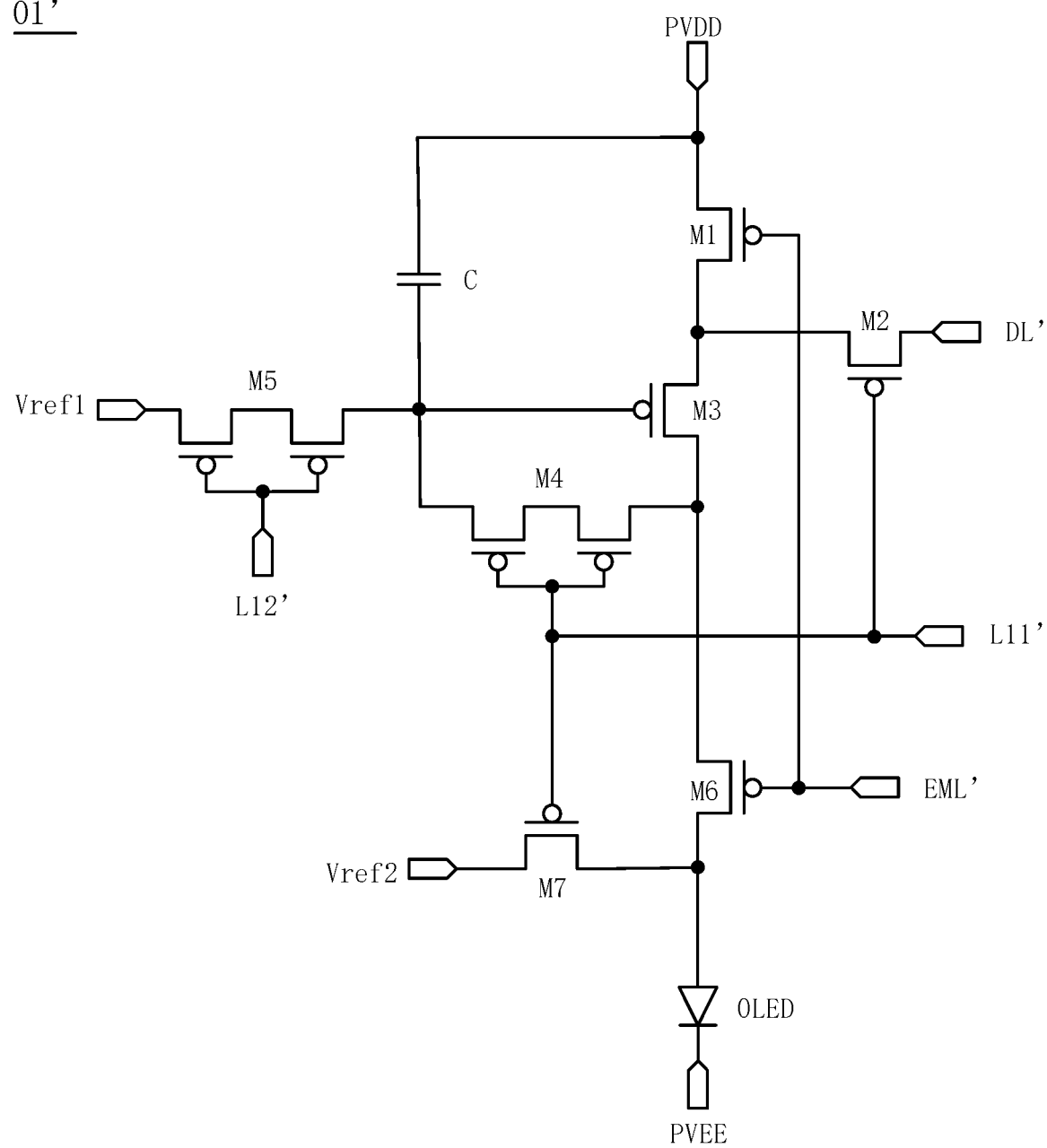
FIG. 3 is a schematic diagram of a pixel circuit in the display panel of FIG. 2.
Figure 4:
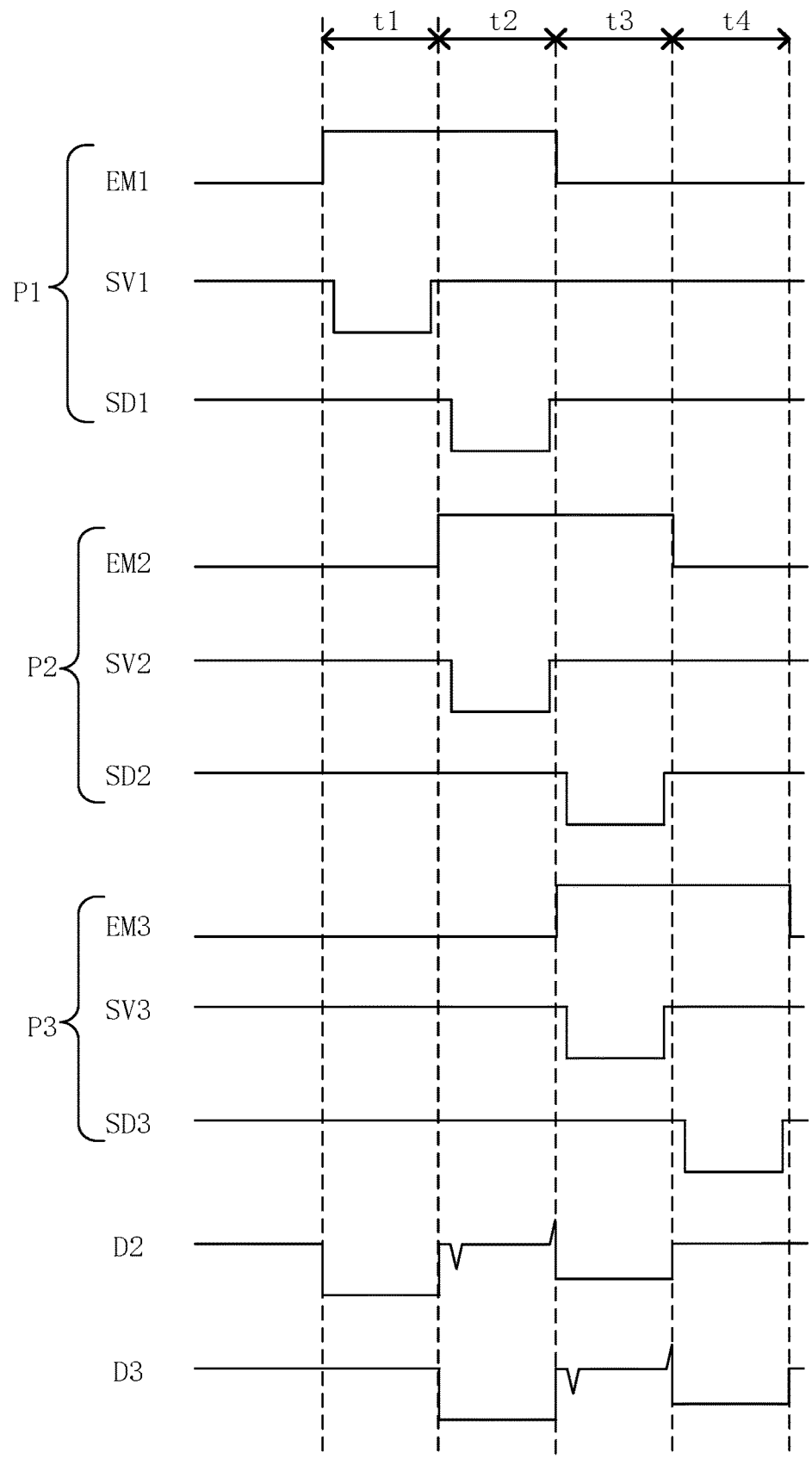
FIG. 4 is a drive timing graph of a display region of FIG. 2.

FIG. 2 is a partial structure diagram of the display panel of FIG. 1. FIG. 3 is a schematic diagram of a pixel circuit in the display panel of FIG. 2. FIG. 4 is a drive timing graph of a display region of FIG. 2. Referring to FIGS. 2, 3, and 4, the display panel further includes a first gate driving circuit VSR1' and a second gate driving circuit VSR2'. The display region AA' further includes pulse control lines L1' and light emission control lines EML'. The first gate driving circuit VSR1' includes a plurality of cascaded shift registers L-VSR', and the shift registers L-VSR' provide scan signals to the pulse control lines L1'. The second gate driving circuit VSR2' includes a plurality of cascaded shift registers E-VSR', and the shift registers E-VSR' provide light emission control signals to the light emission control lines EML'. The pulse control lines L1' include first control sublines L11' and second control sublines L12'. A pixel circuit 01' includes a power write transistor M1, a data write transistor M2, a drive transistor M3, a compensation transistor M4, a first reset transistor M5, a light emission control transistor M6, a second reset transistor M7, and a storage capacitor C. A second control subline L12' is coupled to gates of first reset transistors M5 in pixel circuits 01' in the same row and configured to provide a scan signal as a reset control signal to the gates of the first reset transistors M5, where when the reset control signal is at an enable level, a potential of a gate of the drive transistor M3 is reset. A first control subline L11' is coupled to gates of data write transistors M2 in pixel circuits 01' in the same row and configured to provide a scan signal as a write control signal to the gates of the data write transistors M2, where when the write control signal is at an enable level, a data signal is written to the gate of the drive transistor M3. A light emission control line EML' is coupled to gates of power write transistors M1 and gates of light emission control transistors M6 in pixel circuits 01' in the same row and configured to provide a light emission control signal. A write control signal provided for the N-th row of pixel circuits P(N) is denoted as an N-th write control signal SD(N), a reset control signal provided for the N-th row of pixel circuits P(N) is denoted as an N-th reset control signal SV(N), a data signal provided for the M-th column of pixel circuits 01' is denoted as an M-th data signal D(M), and a light emission control signal provided for the N-th row of pixel circuits P(N) is denoted as an N-th data signal EM(N), where N and M are positive integers. The N-th row of pixel circuits P(N) refers to pixel circuits 01' in the N-th row.

It is to be understood that the display region AA' further includes a first power signal line PVDD, a second power signal line PVEE, a first reset signal line Vref1, and a second reset signal line Vref2 (not shown). The first power signal line PVDD is coupled to power write transistors M1 in all pixel circuits 01' and configured to provide a first power signal. The second power signal line PVEE is coupled to light-emitting elements OLED in all the pixel circuits 01' and configured to provide a second power signal, where each light-emitting element OLED is driven by the pixel circuit 01' and includes, but is not limited to, a light-emitting device such as a micro LED and a mini LED. The first reset signal line Vref1 is coupled to first reset transistors M5 in all the pixel circuit 01' and configured to provide a first reset signal. The second reset signal line Vref2 is coupled to second reset transistors M7 in all the pixel circuit 01' and configured to provide a second reset signal. Generally, the first power signal, the second power signal, the first reset signal, and the second reset signal are all fixed signals. Of course, in some application scenarios, at least one of the first power signal, the second power signal, the first reset signal, or the second reset signal may be configured to be a variable signal. It is no longer described in the embodiments of the present disclosure.

In the related art, the first control subline L11' is electrically connected to the second control subline L12' in the next row, which are both provided with a signal by the same shift register L-VSR'. The row in the embodiments of the present disclosure refers to a row formed by the pixel circuits arranged in an array. For two adjacent rows of pixel circuits 01', a reset control signal SV(N+1) for the (N+1)-th row is the same as the write control signal SD(N) for the N-th row. For the same row of pixel circuits 01', the reset control signal SV(N) for the N-th row is before the write control signal SD(N) for the N-th row, and the reset control signal SV(N+1) for the (N+1)-th row is before a write control signal SD(N+1) for the (N+1)-th row. For example, a stage t1 is before a stage t2. At the stage t1, the gate of the drive transistor M3 is reset for the first row of pixel circuits P1. At the stage t2, the data signal is written for the first row of pixel circuits P1, and the gate of the drive transistor M3 is reset for the second row of pixel circuits P2. When a first write control signal SD1 jumps, a second reset control signal SV2 also jumps. The first connection wire segment FL-a' relatively close to the second control subline L12' in the second row is coupled, and a second data signal D2 on a data line DL' in the second column and electrically connected to the first connection wire segment FL-a' in the second row is lowered or raised due to the jump coupling of the second reset control signal SV2, resulting in the brightening or darkening of a sub-pixel driven by the second pixel circuit 01' in the first row. At a stage t3, the data signal is written for the second row of pixel circuits P2, and the gate of the drive transistor M3 is reset for the third row of pixel circuits P3. When a second write control signal SD2 jumps, a third reset control signal SV3 also jumps. The first connection wire segment FL-a' relatively close to the second control subline L12' in the third row is coupled, and a third data signal D3 on a data line DL' in the third column and electrically connected to the first connection wire segment FL-a' in the third row is lowered or raised due to the jump coupling of the third reset control signal SV3, resulting in the brightening or darkening of a sub-pixel driven by the third pixel circuit 01' in the second row. At a stage t4, the data signal is written into the third row of pixel circuits P3. Similarly, the brightening or darkening of a sub-pixel driven by the fourth pixel circuit 01' in the third row is caused.

For the same row of pixel circuits 01', when the reset control signal controls the pixel circuit 01' to reset the gate of the drive transistor M3 and the write control signal controls the pixel circuit 01' to perform the data signal writing, the light emission control signal is always at a disable level of the power write transistor M1 and the light emission control transistor M6. After the pixel circuit 01' performs the data signal writing, the light emission control signal jumps to an enable level of the power write transistor M1 and the light emission control transistor M6. Therefore, the light emission control signal does not affect the data signal for this row when the pixel circuit 01' performs the data signal writing. For example, when a light emission control signal EM1 for the first row jumps, the first row of pixel circuits P1 has already performed the data signal writing, when a light emission control signal EM2 for the second row jumps, the second row of pixel circuits P2 has already performed the data signal writing; when a light emission control signal EM3 for the third row jumps, the third row of pixel circuits P3 has already performed the data signal writing.

Based on this, the embodiments of the present disclosure provide a display panel where a signal write control line in the previous row is not multiplexed as a reset control line in a display region. A reset control signal is designed so that the problem of abnormal light emission of sub-pixels is solved.

Figure 5:
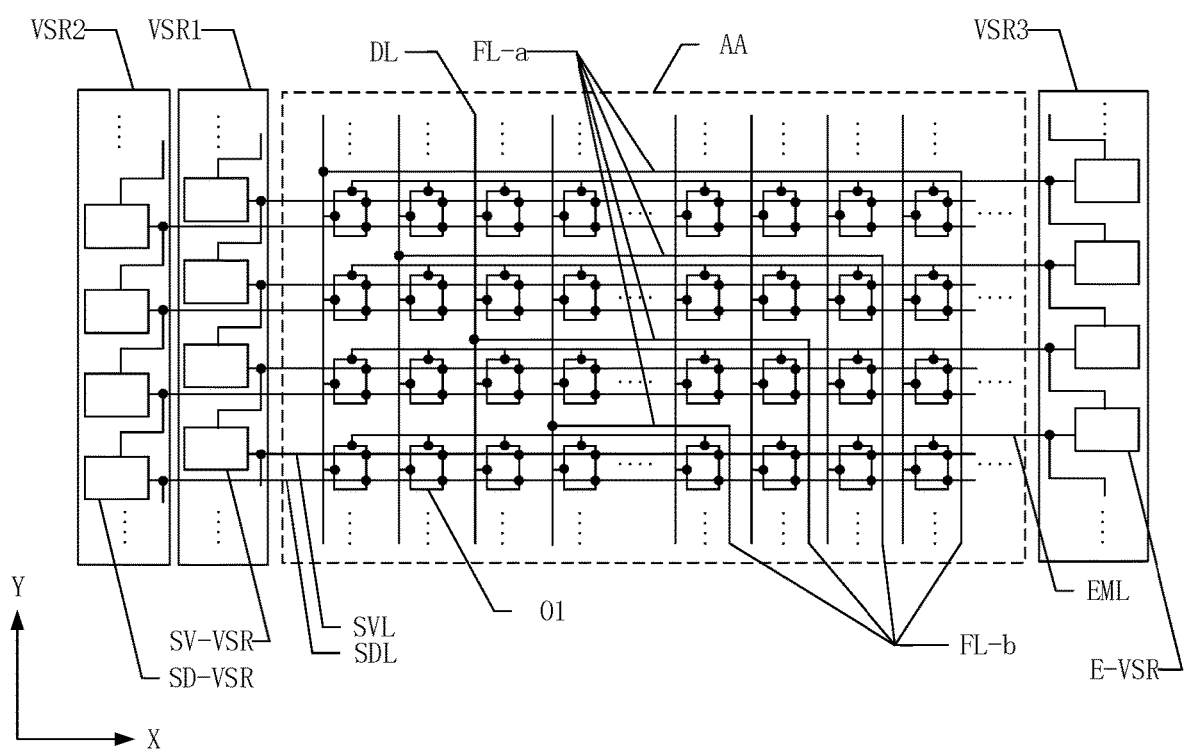
FIG. 5 is a top view of a display panel according to an embodiment of the present disclosure.
Figure 6:
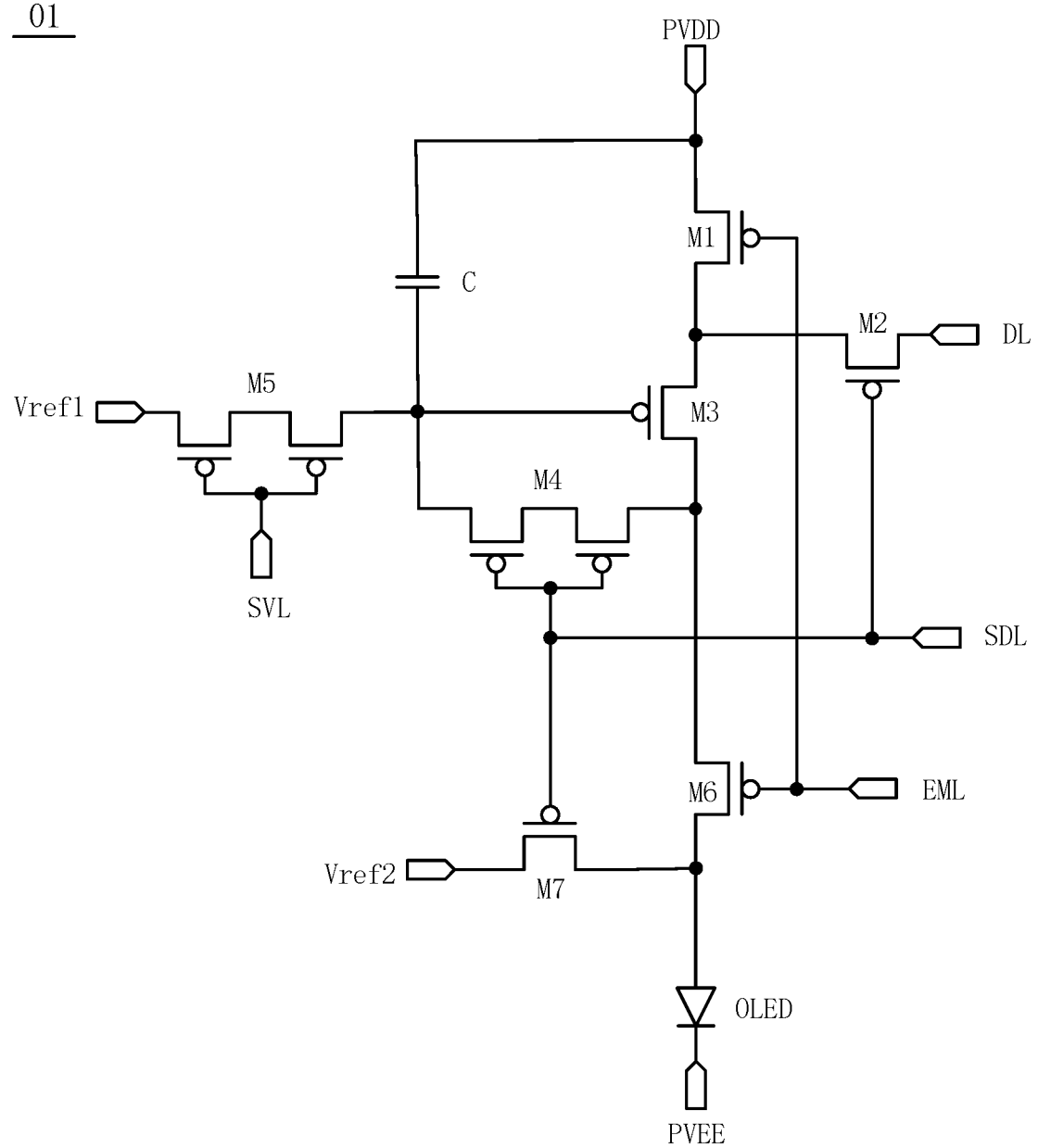
FIG. 6 is a schematic diagram of a pixel circuit in the display panel of FIG. 5.
Figure 7:
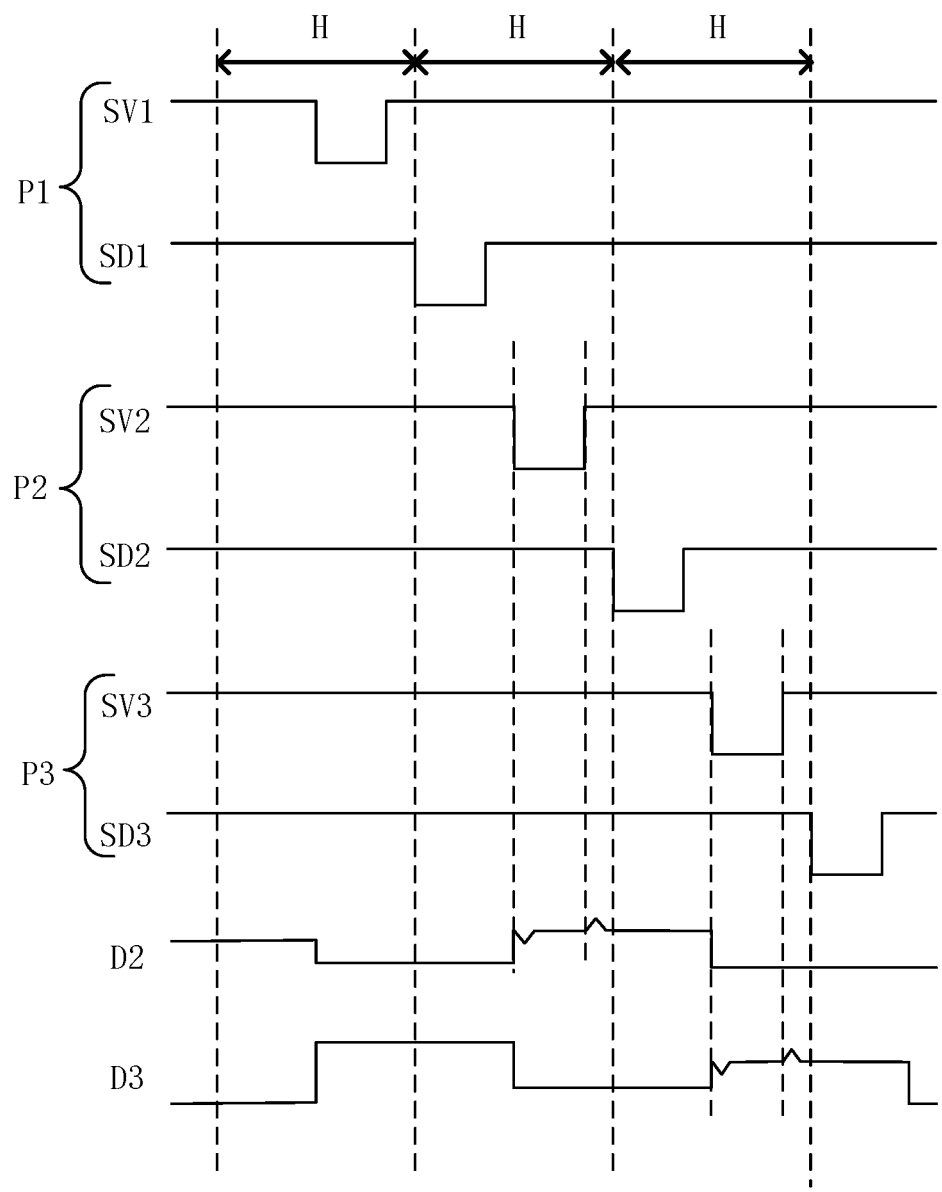
FIG. 7 is a drive timing graph of a display region according to an embodiment of the present disclosure.

FIG. 5 is a top view of a display panel according to an embodiment of the present disclosure. FIG. 6 is a schematic diagram of a pixel circuit in the display panel of FIG. 5. FIG. 7 is a drive timing graph of a display region according to an embodiment of the present disclosure. Referring to FIGS. 5, 6, and 7, for simplification of the drawings and ease of description, only part of the structure of the display panel is shown in FIG. 5. The display panel includes a display region AA including a plurality of pixel circuits 01, a plurality of signal write control lines SDL, a plurality of reset control lines SVL, a plurality of data lines DL, and a plurality of connection wires FL. The plurality of pixel circuits 01 are arranged in an array along a first direction X and a second direction Y, arranged in rows along the first direction X, and arranged in columns along the second direction Y. The plurality of signal write control lines SDL and the plurality of reset control lines SVL are arranged along the second direction Y. In an embodiment, the plurality of signal write control lines SDL and the plurality of reset control lines SVL extend along the first direction X. The plurality of data lines DL are arranged along the first direction X. In an embodiment, the plurality of data lines DL extend along the second direction Y. Each connection wire FL includes a first connection wire segment FL-a extending along the first direction X and a second connection wire segment FL-b extending along the second direction Y, the first connection wire segment FL-a is electrically connected to a data line DL, and the second connection wire segment FL-b is electrically connected to a fan-out wire in a non-display region.

The display region AA further includes light emission control lines EML. The display panel further includes a reset scan driving circuit VSR1, a write scan driving circuit VSR2, and a light emission scan driving circuit VSR3. The reset scan driving circuit VSR1 includes a plurality of cascaded shift registers SV-VSR, and the shift registers SV-VSR provide reset control signals for the reset control lines SVL. The write scan driving circuit VSR2 includes a plurality of cascaded shift registers SD-VSR, and the shift registers SD-VSR provide write control signals for the signal write control lines SDL. The light emission scan driving circuit VSR3 includes a plurality of cascaded shift registers E-VSR, and the shift registers E-VSR provide light emission control signals for the light emission control lines EML. The reset control lines SVL and the signal write control lines SDL disposed separately are used in the display panel to provide the reset control signals and the write control signals, respectively, thereby providing an abundant design space for the reset control signals and the write control signals.

It is to be noted that the drawings only illustrate that the reset scan driving circuit VSR1, the write scan driving circuit VSR2, and the light emission scan driving circuit VSR3 are each disposed on a side of the display region AA. In other embodiments, at least one of the reset scan driving circuit VSR1, the write scan driving circuit VSR2, or the light emission scan driving circuit VSR3 may be disposed on two or three sides of the display region AA. The specific arrangement manner of the reset scan driving circuit VSR1, the write scan driving circuit VSR2, and the light emission scan driving circuit VSR3 is not limited in the embodiments of the present disclosure.

The structure of a pixel circuit 01 the same as that in the related art is not repeated, and only differences are described. In the pixel circuit 01, a gate of a first reset transistor M5 is coupled to a reset control line SVL, and a gate of a data write transistor M2 is coupled to a signal write control line SDL. Each transistor in the pixel circuit 01 is a p-type transistor. In other optional embodiments, each transistor in the pixel circuit 01 may be an n-type transistor, or some transistors are p-type transistors and some transistors are n-type transistors. Different enable levels may be provided according to different types of transistors, where the enable level is a level enabling the transistor to be turned on. For example, for the p-type transistor, the enable level is a low level; for the n-type transistor, the enable level is a high level.

In the embodiments of the present disclosure, the enable level of a signal refers not only to a low level or a high level for controlling the transistor to be turned on but also to a period during which the signal controls the transistor to be turned on and in an on state. Generally, in a timing, the enable level is considered as the period during which the signal controls the transistor to be turned on and in the on state, a first voltage edge is a starting moment from which the signal controls the transistor to be turned on and in the on state, and a second voltage edge is a terminating moment to which the signal controls the transistor to be turned on and in the on state. In the enable level of the same reset control signal, the second voltage edge is after the first voltage edge, and in the enable level of the same write control signal, the second voltage edge is also after the first voltage edge.

A reset control signal provided for the (N+i+1)-th row of pixel circuits P(N+i+1) is denoted as an (N+i+1)-th reset control signal SV(N+i+1), and a write control signal provided for the N-th row of pixel circuits P(N) is denoted as an N-th write control signal SD(N). A first voltage edge of an enable level of the (N+i+1)-th reset control signal SV(N+i+1) does not overlap an enable level of the N-th write control signal SD(N) and/or a second voltage edge of an enable level of the (N+i+1)-th reset control signal SV(N+i+1) does not overlap an enable level of the N-th write control signal SD(N) so that the first voltage edge and/or the second voltage edge of the enable level of the (N+i+1)-th reset control signal SV(N+i+1) can be set outside the enable level of the N-th write control signal SD(N), and when a data signal is written to the N-th row of pixel circuits P(N), the (N+i+1)-th reset control signal SV(N+i+1) does not jump, and the data signal does not change. In the above, i is a natural number, and i is 0, 1, 2, 3, . . . .

For example, i=0. When an (N+1)-th reset control signal SV(N+1) jumps, the N-th write control signal SD(N) has already controlled the N-th row of pixel circuits P(N) to perform the data signal writing. Referring to FIG. 7, when a second data signal D2 changes due to the jump coupling of a second reset control signal SV2, a first write control signal SD1 has already controlled the first row of pixel circuits P1 to perform the data signal writing, and a normal second data signal D2 may be written to the first row of pixel circuits P1. When a third data signal D3 changes due to the jump coupling of a third reset control signal SV3, a second write control signal SD2 has already controlled the second row of pixel circuits P2 to perform the data signal writing, and a normal third data signal D3 may be written to the second row of pixel circuits P2. When i=0, the reset control signal and the write control signal with the same serial number are synchronously adjacent.

Figure 8:
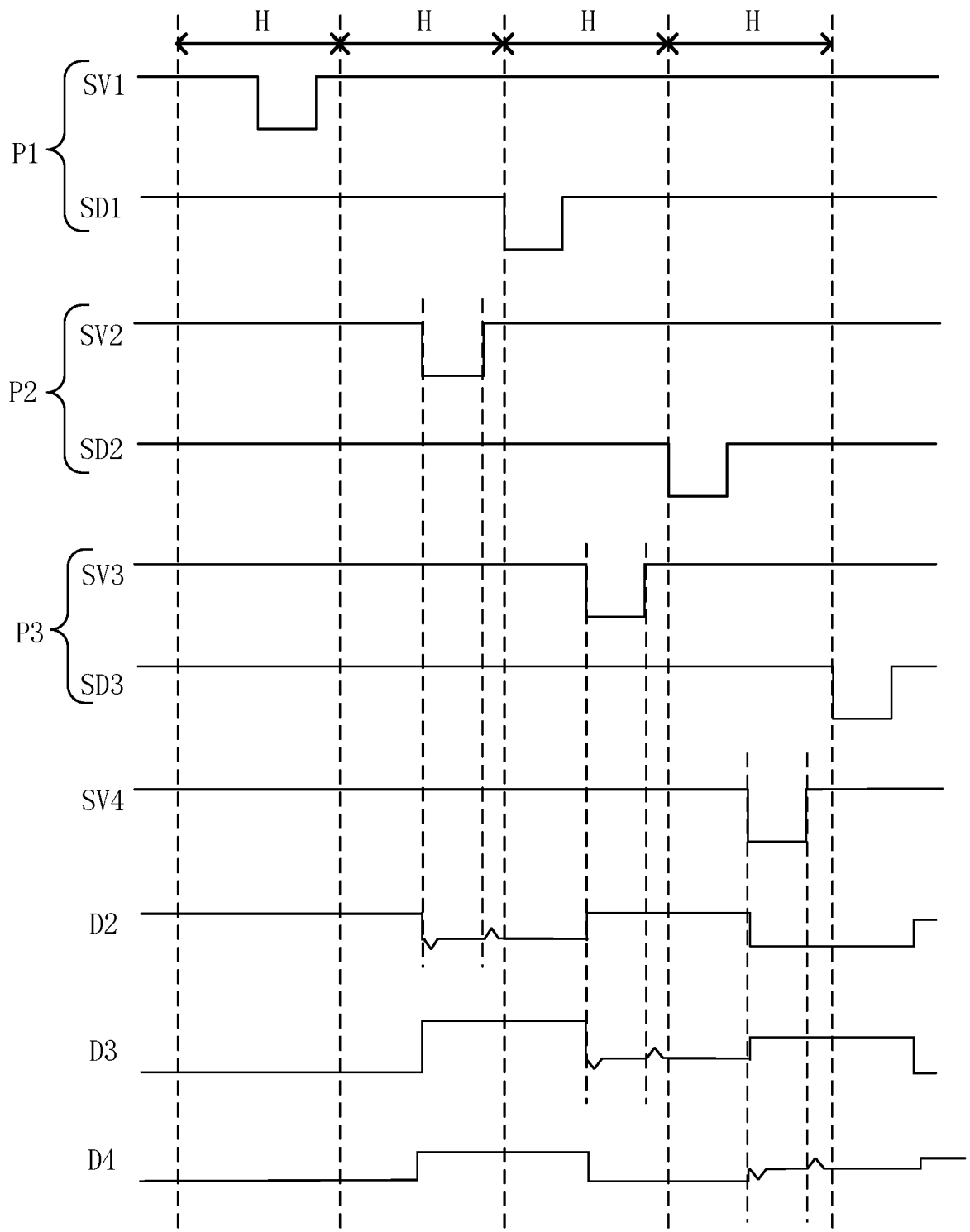
FIG. 8 is another drive timing graph of a display region according to an embodiment of the present disclosure.

FIG. 8 is another drive timing graph of a display region according to an embodiment of the present disclosure, where i=1. When an (N+2)-th reset control signal SV(N+2) jumps, the N-th write control signal SD(N) has already controlled the N-th row of pixel circuits P(N) to perform the data signal writing. Referring to FIG. 8, when the third data signal D3 changes due to the jump coupling of the third reset control signal SV3, the first write control signal SD1 has already controlled the first row of pixel circuits P1 to perform the data signal writing, and the normal third data signal D3 may be written to the first row of pixel circuits P1. When a fourth data signal D4 changes due to the jump coupling of a fourth reset control signal SV4, the second write control signal SD2 has already controlled the second row of pixel circuits P2 to perform the data signal writing, and a normal fourth data signal D4 may be written to the second row of pixel circuits P2. Similarly, in the case where i is another positive integer, when the (N+i+1)-th reset control signal SV(N+i+1) jumps, the N-th write control signal SD(N) has already controlled the N-th row of pixel circuits P(N) to perform the data signal writing. When i=1, the reset control signal and the write control signal with the same serial number are spaced by one unit duration H. In contrast to that in FIG. 7, the reset control signal in FIG. 8 is moved forward by one unit duration H.

For example, referring to FIG. 8, i=1. When the (N+1)-th reset control signal SV(N+1) jumps, the N-th write control signal SD(N) has not controlled the N-th row of pixel circuits P(N) to perform the data signal writing. For example, when the second data signal D2 changes due to the jump coupling of the second reset control signal SV2, the first write control signal SD1 has not controlled the first row of pixel circuits P1 to enter a stage for writing the data signal, and when the first write control signal SD1 controls the first row of pixel circuits P1 to perform the data signal writing, the second data signal D2 has already returned to normal, and the normal second data signal D2 may be written to the first row of pixel circuits P1. When the third data signal D3 changes due to the jump coupling of the third reset control signal SV3, the second write control signal SD2 has not controlled the second row of pixel circuits P2 to perform the data signal writing, and when the second write control signal SD2 controls the second row of pixel circuits P2 to perform the data signal writing, the third data signal D3 has already returned to normal, and the normal third data signal D3 may be written to the second row of pixel circuits P2.

In the display panel provided in the embodiments of the present disclosure, the first voltage edge of the enable level of the (N+i+1)-th reset control signal SV(N+i+1) does not overlap the enable level of the N-th write control signal SD(N) and/or the second voltage edge of the enable level of the (N+i+1)-th reset control signal does not overlap the enable level of the N-th write control signal. Thus, the moment when the reset control signal jumps can avoid the period during which the write control signal controls the N-th row of pixel circuits P(N) to perform data writing. In the period during which the write control signal controls the pixel circuit 01 to perform data writing, the reset control signal does not cause an abnormal data signal, thereby reducing an effect of the coupling between the reset control line SVL and the first connection wire segment FL-a of the connection wire FL on the data signal when the pixel circuit 01 performs data writing. The writing of an accurate data signal into each pixel circuit 01 is facilitated, and the display effect of the display panel is improved.

Optionally, the second voltage edge of the enable level of the (N+i+1)-th reset control signal SV(N+i+1) is after the enable level of the N-th write control signal SD(N).

For example, with continued reference to FIG. 7, the enable level is the low level, the first voltage edge is a falling edge, and the second voltage edge is a rising edge. When i=0 and N=1, a rising edge of the second reset control signal SV2 is after an enable level of the first write control signal SD1. When the rising edge of the second reset control signal SV2 affects the second data signal D2, the first row of pixel circuits P1 has already written the data signal. When i=0 and N=2, a rising edge of the third reset control signal SV3 is after an enable level of the second write control signal SD2. When the rising edge of the third reset control signal SV3 affects the third data signal D3, the second row of pixel circuits P2 has already written the data signal. Thus, when a second voltage edge of an enable level of the (N+1)-th reset control signal SV(N+1) appears, a data writing process of the N-th row of pixel circuits P(N) corresponding to the N-th write control signal SD(N) has been completed, and the second voltage edge of the (N+1)-th reset control signal SV(N+1) does not affect the writing of an (N+1)-th data signal D(N+1) into the N-th row of pixel circuits P(N) so that the accuracy of the (N+1)-th data signal D(N+1) in the data writing process can be improved, and the (N+1)-th data signal D(N+1) can be written into the N-th row of pixel circuits P(N) at a relatively accurate potential, thereby improving the display effect.

With continued reference to FIG. 8, when i=1 and N=1, the rising edge of the third reset control signal SV3 is after the enable level of the first write control signal SD1. When the rising edge of the third reset control signal SV3 affects the third data signal D3, the first row of pixel circuits P1 has already written the data signal. When i=1 and N=2, a rising edge of the fourth reset control signal SV4 is after the enable level of the second write control signal SD2. When the rising edge of the fourth reset control signal SV4 affects the fourth data signal D4, the second row of pixel circuits P2 has already written the data signal. Thus, when a second voltage edge of an enable level of the (N+2)-th reset control signal SV(N+2) appears, the data writing process of the N-th row of pixel circuits P(N) corresponding to the N-th write control signal SD(N) has been completed, and the second voltage edge of the (N+2)-th reset control signal SV(N+2) does not affect the writing of an (N+2)-th data signal D(N+2) into the N-th row of pixel circuits P(N) so that the accuracy of the (N+2)-th data signal D(N+2) in the data writing process can be improved, and the (N+2)-th data signal D(N+2) can be written into the N-th row of pixel circuits P(N) at a relatively accurate potential, thereby improving the display effect. It is to be understood that the reset control signal in FIG. 8 may continue to be moved forward, and i may be other integers, which are not repeated one by one in the embodiments of the present disclosure.

Optionally, the first voltage edge of the enable level of the (N+i+1)-th reset control signal SV(N+i+1) is after the enable level of the N-th write control signal SD(N).

For example, with continued reference to FIG. 7, when i=0 and N=1, a falling edge of the second reset control signal SV2 is after the enable level of the first write control signal SD1. When the falling edge of the second reset control signal SV2 affects the second data signal D2, the first row of pixel circuits P1 has already written the data signal. When i=0 and N=2, a falling edge of the third reset control signal SV3 is after the enable level of the second write control signal SD2. When the falling edge of the third reset control signal SV3 affects the third data signal D3, the second row of pixel circuits P2 has already written the data signal. Thus, when a first voltage edge of the enable level of the (N+1)-th reset control signal SV(N+1) appears, the data writing process of the N-th row of pixel circuits P(N) corresponding to the N-th write control signal SD(N) has been completed, and the first voltage edge of the (N+1)-th reset control signal SV(N+1) does not affect the writing of the (N+1)-th data signal D(N+1) into the N-th row of pixel circuits P(N) so that the accuracy of the (N+1)-th data signal D(N+1) in the data writing process can be improved, and the (N+1)-th data signal D(N+1) can be written into the N-th row of pixel circuits P(N) at a relatively accurate potential, thereby improving the display effect.

With continued reference to FIG. 8, when i=1 and N=1, the falling edge of the third reset control signal SV3 is after the enable level of the first write control signal SD1. When the falling edge of the third reset control signal SV3 affects the third data signal D3, the first row of pixel circuits P1 has already written the data signal. When i=1 and N=2, a falling edge of the fourth reset control signal SV4 is after the enable level of the second write control signal SD2. When the falling edge of the fourth reset control signal SV4 affects the fourth data signal D4, the second row of pixel circuits P2 has already written the data signal. Thus, when a first voltage edge of the enable level of the (N+2)-th reset control signal SV(N+2) appears, the data writing process of the N-th row of pixel circuits P(N) corresponding to the N-th write control signal SD(N) has been completed, and the first voltage edge of the (N+2)-th reset control signal SV(N+2) does not affect the writing of the (N+2)-th data signal D(N+2) into the N-th row of pixel circuits P(N) so that the accuracy of the (N+2)-th data signal D(N+2) in the data writing process can be improved, and the (N+2)-th data signal D(N+2) can be written into the N-th row of pixel circuits P(N) at a relatively accurate potential, thereby improving the display effect. It is to be understood that the reset control signal in FIG. 8 may continue to be moved forward, and i may be other integers, which are not repeated one by one in the embodiments of the present disclosure.

Optionally, the first voltage edge of the enable level of the (N+i+1)-th reset control signal SV(N+i+1) is before the enable level of the N-th write control signal SD(N).

Figure 9:
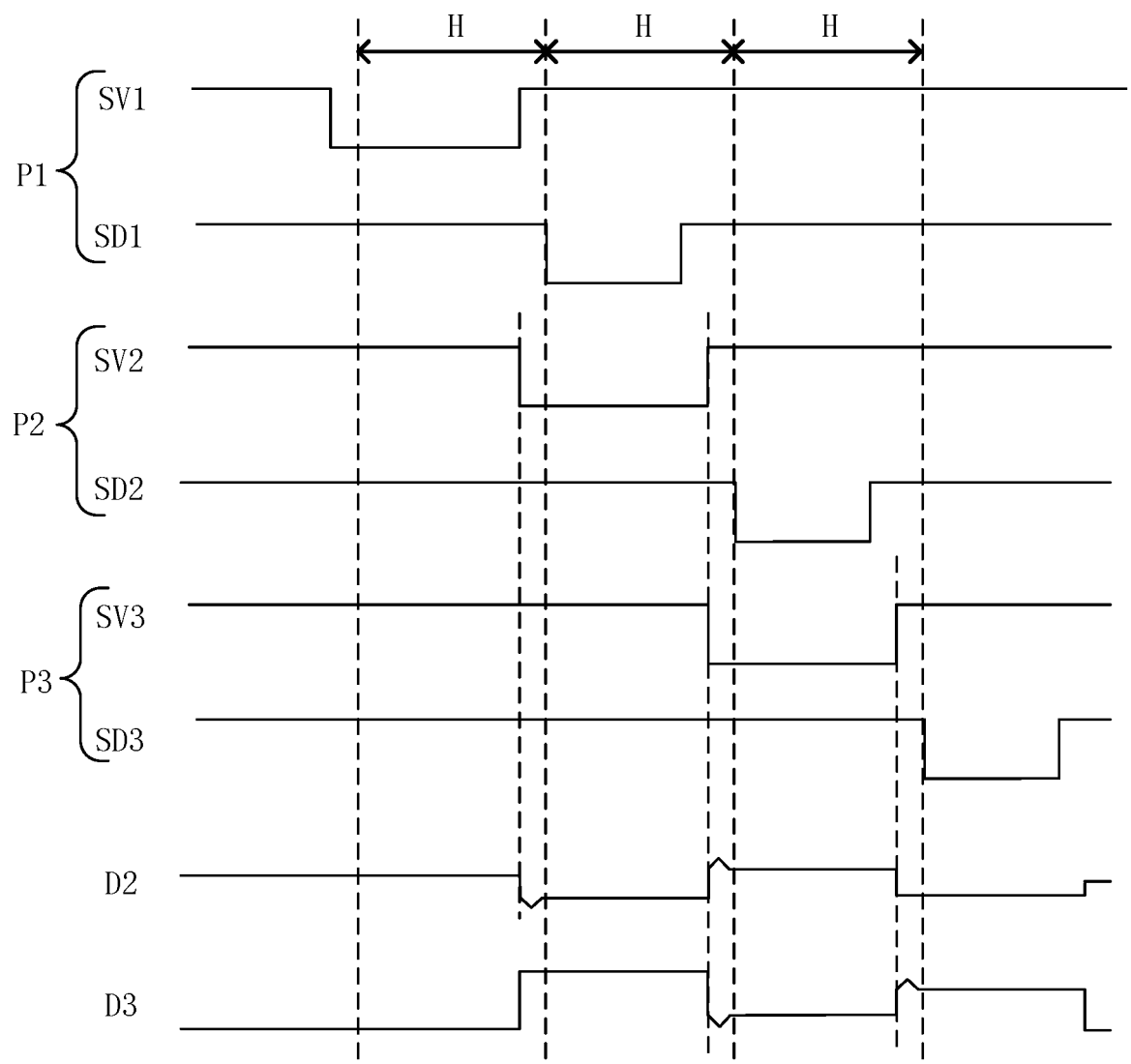
FIG. 9 is another drive timing graph of a display region according to an embodiment of the present disclosure.

For example, FIG. 9 is another drive timing graph of a display region according to an embodiment of the present disclosure. Referring to FIG. 9, the enable level is the low level, the first voltage edge is the falling edge, and the second voltage edge is the rising edge. When i=0 and N=1, the falling edge of the second reset control signal SV2 is before the enable level of the first write control signal SD1. When the falling edge of the second reset control signal SV2 affects the second data signal D2, the first row of pixel circuits P1 has not written the data signal, and when the first row of pixel circuits P1 performs the data signal writing, the second data signal D2 has returned to normal. When i=0 and N=2, the falling edge of the third reset control signal SV3 is before the enable level of the second write control signal SD2. When the falling edge of the third reset control signal SV3 affects the third data signal D3, the second row of pixel circuits P2 has not written the data signal, and when the second row of pixel circuits P2 performs the data signal writing, the third data signal D3 has returned to normal. When i=0, the reset control signal and the write control signal with the same serial number are synchronously adjacent. When the first voltage edge of the enable level of the (N+1)-th reset control signal SV(N+1) appears, the N-th row of pixel circuits P(N) corresponding to the N-th write control signal SD(N) has not started the data writing process, and when the N-th row of pixel circuits P(N) performs an N-th data signal D(N) writing, the (N+1)-th data signal D(N+1) affected by the first voltage edge of the (N+1)-th reset control signal SV(N+1) has returned to normal, and the (N+1)-th data signal D(N+1) can be written into the N-th row of pixel circuits P(N) at a relatively accurate potential, thereby improving the display effect.

Figure 10:
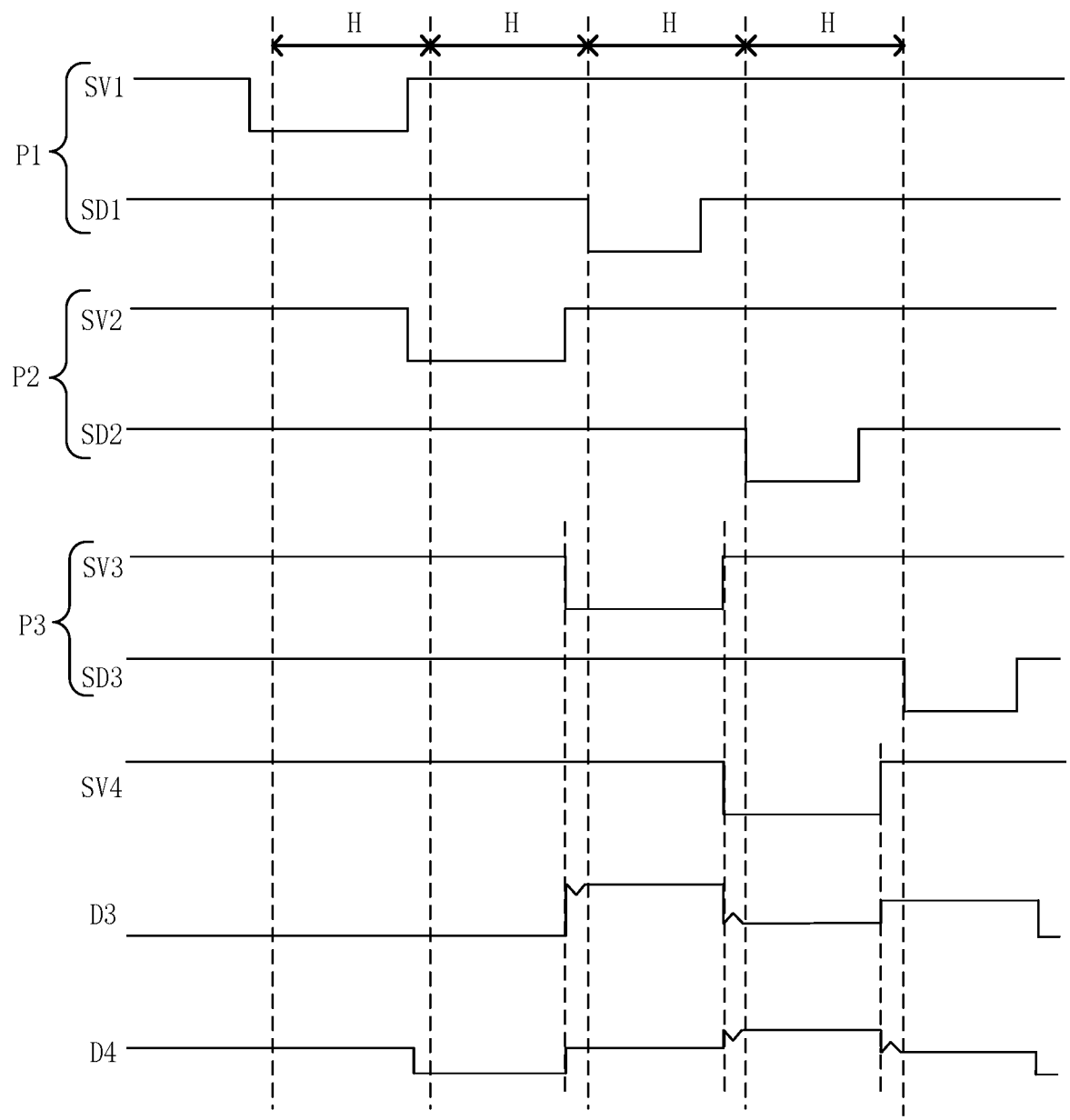
FIG. 10 is another drive timing graph of a display region according to an embodiment of the present disclosure.

FIG. 10 is another drive timing graph of a display region according to an embodiment of the present disclosure. Referring to FIG. 10, when i=1 and N=1, the falling edge of the third reset control signal SV3 is before the enable level of the first write control signal SD1. When the falling edge of the third reset control signal SV3 affects the third data signal D3, the first row of pixel circuits P1 has not written the data signal, and when the first row of pixel circuits P1 performs the data signal writing, the third data signal D3 has returned to normal. When i=1 and N=2, the falling edge of the fourth reset control signal SV4 is before the enable level of the second write control signal SD2. When the falling edge of the fourth reset control signal SV4 affects the fourth data signal D4, the second row of pixel circuits P2 has not written the data signal, and when the second row of pixel circuits P2 performs the data signal writing, the fourth data signal D4 has returned to normal. When i=1, the reset control signal and the write control signal with the same serial number are spaced by one unit duration H. In contrast to that in FIG. 9, the reset control signal in FIG. 10 is moved forward by one unit duration H. When the first voltage edge of the enable level of the (N+2)-th reset control signal SV(N+2) appears, the N-th row of pixel circuits P(N) corresponding to the N-th write control signal SD(N) has not started the data writing process, and when the N-th row of pixel circuits P(N) performs the N-th data signal D(N) writing, the (N+2)-th data signal D(N+2) affected by the first voltage edge of the (N+2)-th reset control signal SV(N+2) has returned to normal, and the (N+2)-th data signal D(N+2) can be written into the N-th row of pixel circuits P(N) at a relatively accurate potential, thereby improving the display effect. It is to be understood that the reset control signal in FIG. may continue to be moved forward, and i may be other integers, which are not repeated one by one in the embodiments of the present disclosure.

Optionally, a time interval between the first voltage edge of the enable level of the (N+i+1)-th reset control signal SV(N+i+1) and a first voltage edge of the enable level of the N-th write control signal SD(N) is greater than a first threshold.

The first threshold refers to a time period for a potential of the data signal to return to a normal potential after being affected by the first voltage edge of the enable level of the reset control signal.

Figure 11:
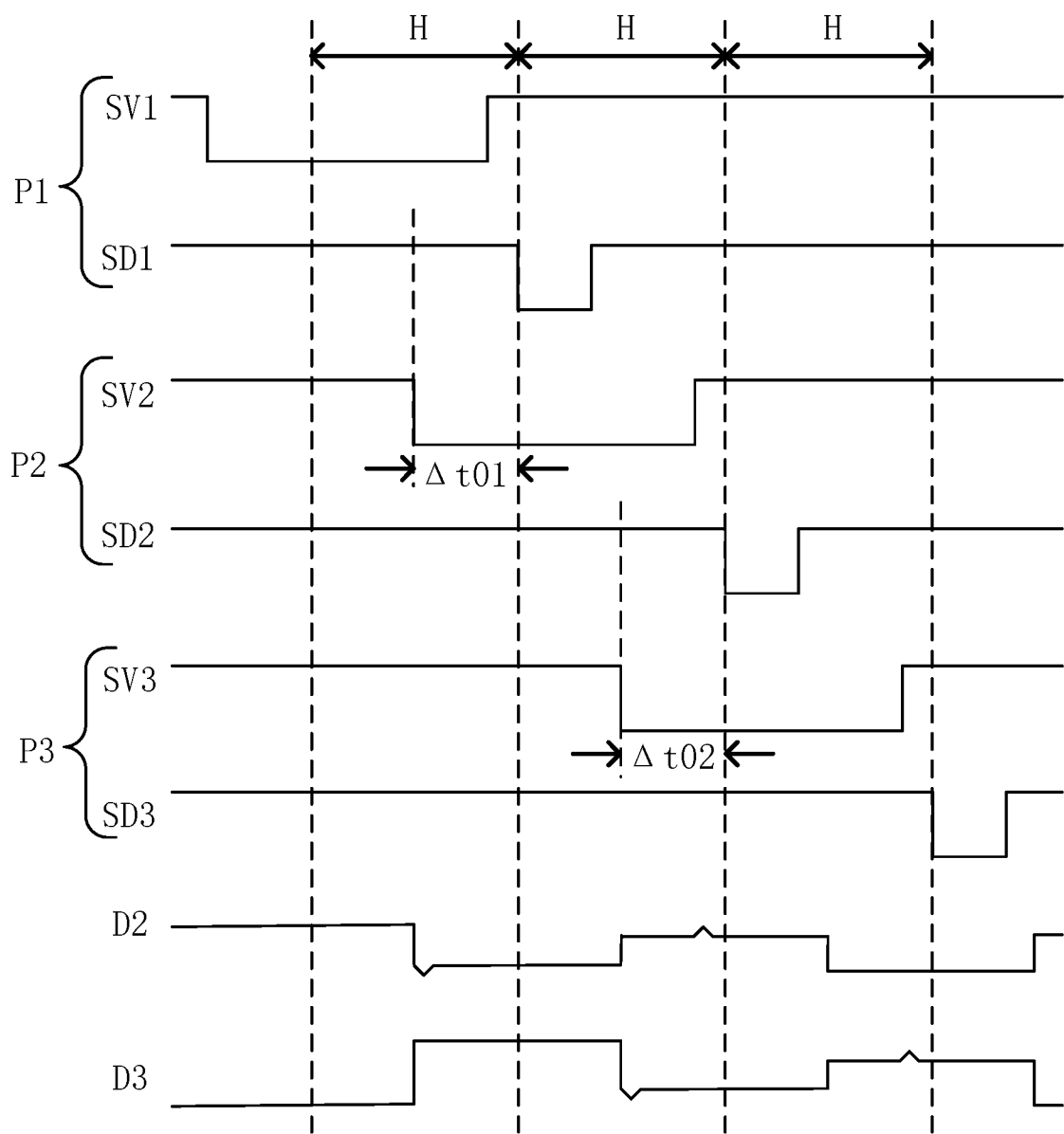
FIG. 11 is another drive timing graph of a display region according to an embodiment of the present disclosure.

For example, FIG. 11 is another drive timing graph of a display region according to an embodiment of the present disclosure. Referring to FIG. 11, the enable level is the low level, the first voltage edge is the falling edge, and the second voltage edge is the rising edge. When i=0 and N=1, the falling edge of the second reset control signal SV2 is before a falling edge of the first write control signal SD1, and a time interval Δt01 between the falling edge of the second reset control signal SV2 and the falling edge of the first write control signal SD1 is greater than the first threshold. When i=0 and N=2, the falling edge of the third reset control signal SV3 is before a falling edge of the second write control signal SD2, and a time interval Δt02 between the falling edge of the third reset control signal SV3 and the falling edge of the second write control signal SD2 is greater than the first threshold. After a relatively long time from when the first voltage edge of the (N+1)-th reset control signal SV(N+1) affects the (N+1)-th data signal D(N+1), the N-th row of pixel circuits P(N) corresponding to the N-th write control signal SD(N) starts the data writing process, and the affected (N+1)-th data signal D(N+1) has enough time to return to the normal potential. Thus, the N-th data signal D(N) with the normal potential can be written into the N-th row of pixel circuits P(N), an effect of the (N+1)-th reset control signal SV(N+1) on the (N+1)-th data signal D(N+1) written into the N-th row of pixel circuits P(N) can be reduced, and the following case can be avoided: when the N-th row of pixel circuits P(N) starts the writing of the data signal, the (N+1)-th data signal D(N+1) has not returned to the normal potential, and an abnormal (N+1)-th data signal D(N+1) is written into the N-th row of pixel circuits P(N).

Figure 12:
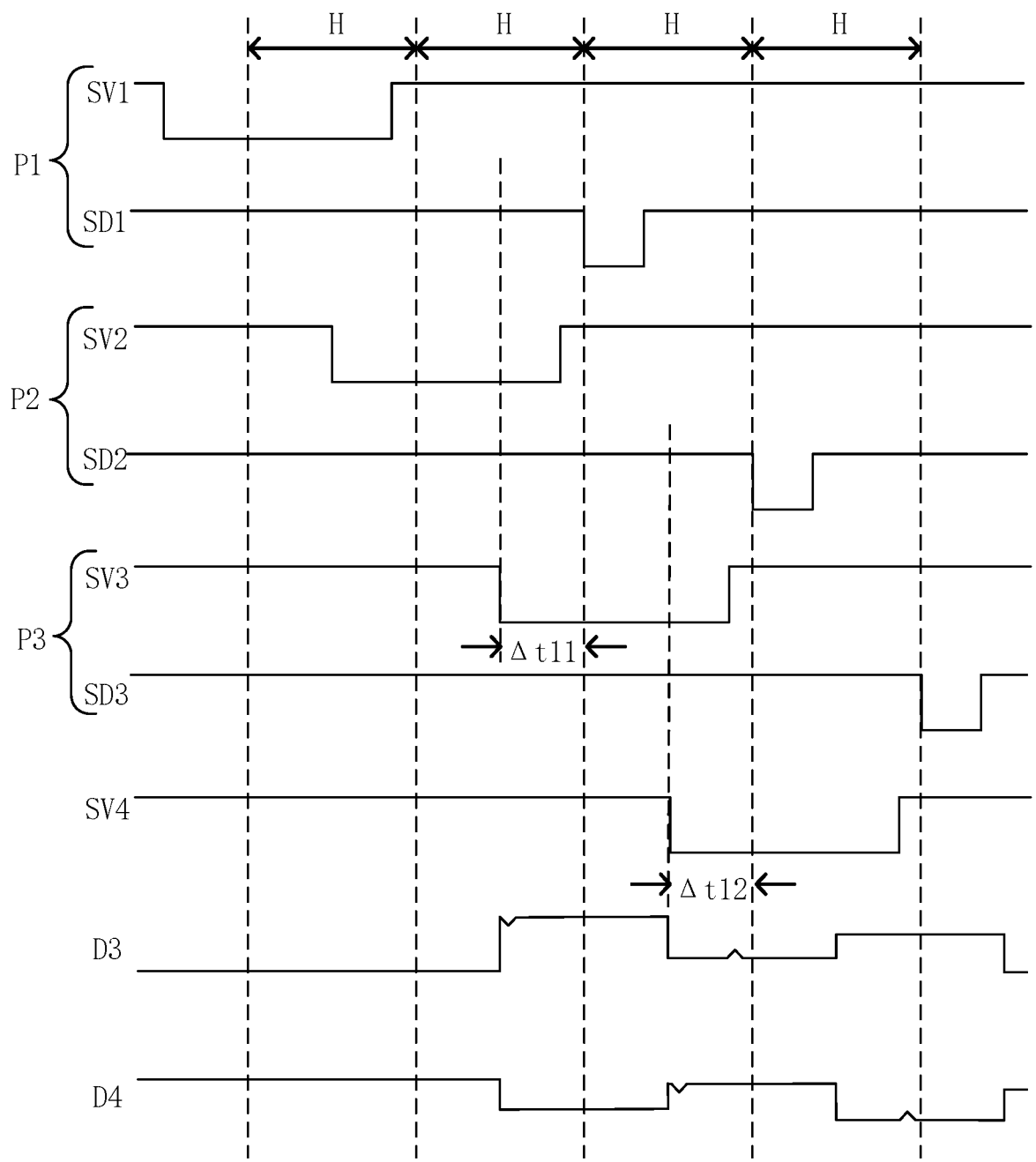
FIG. 12 is another drive timing graph of a display region according to an embodiment of the present disclosure.

FIG. 12 is another drive timing graph of a display region according to an embodiment of the present disclosure. Referring to FIG. 12, when i=1 and N=1, the falling edge of the third reset control signal SV3 is before the falling edge of the first write control signal SD1, and a time interval Δt11 between the falling edge of the third reset control signal SV3 and the falling edge of the first write control signal SD1 is greater than the first threshold. When i=1 and N=2, the falling edge of the fourth reset control signal SV4 is before the falling edge of the second write control signal SD2, and a time interval Δt12 between the falling edge of the fourth reset control signal SV4 and the falling edge of the second write control signal SD2 is greater than the first threshold. After a relatively long time from when the first voltage edge of the (N+2)-th reset control signal SV(N+2) affects the (N+2)-th data signal D(N+2), the N-th row of pixel circuits P(N) corresponding to the N-th write control signal SD(N) starts the data writing process, and the affected (N+2)-th data signal D(N+2) has enough time to return to the normal potential. Thus, the (N+2)-th data signal D(N+2) with the normal potential can be written into the N-th row of pixel circuits P(N), an effect of the (N+2)-th reset control signal SV(N+2) on the data signal written into the N-th row of pixel circuits P(N) can be reduced, and the following case can be avoided: when the N-th row of pixel circuits P(N) starts the writing of the data signal, the (N+2)-th data signal D(N+2) has not returned to the normal potential, and an abnormal (N+2)-th data signal D(N+2) is written into the N-th row of pixel circuits P(N). It is to be understood that in contrast to that in FIG. 11, the reset control signal in FIG. 12 is moved forward by one unit duration H, the reset control signal in FIG. 12 may continue to be moved forward, and i may be other integers, which are not repeated one by one in the embodiments of the present disclosure.

Optionally, a write control signal provided for the (N+1)-th row of pixel circuits P(N+1) is denoted as an (N+1)-th write control signal SD(N+1); where the second voltage edge of the enable level of the (N+i+1)-th reset control signal SV(N+i+1) is before an enable level of the (N+1)-th write control signal SD(N+1).

For example, with continued reference to FIG. 11, the enable level is the low level, the first voltage edge is the falling edge, and the second voltage edge is the rising edge. When i=0 and N=1, the rising edge of the second reset control signal SV2 is after the enable level of the first write control signal SD1 and before the enable level of the second write control signal SD2. When i=0 and N=2, the rising edge of the third reset control signal SV3 is after the enable level of the second write control signal SD2 and before an enable level of a third write control signal SD3. When the second voltage edge of the (N+1)-th reset control signal SV(N+1) appears, the N-th row of pixel circuits P(N) has completed the data writing process, and the (N+1)-th row of pixel circuits P(N+1) has not started the data writing process so that the second voltage edge of the (N+1)-th reset control signal SV(N+1) can be prevented from being too late relative to the enable level of the N-th write control signal SD(N) and affecting the writing of the data signal into the (N+1)-th row of pixel circuits P(N+1).

With continued reference to FIG. 12, when i=1 and N=1, the rising edge of the third reset control signal SV3 is before the enable level of the second write control signal SD2. When i=1 and N=2, the rising edge of the fourth reset control signal SV4 is after the enable level of the second write control signal SD2 and before the enable level of the third write control signal SD3. When the second voltage edge of the (N+2)-th reset control signal SV(N+2) appears, the N-th row of pixel circuits P(N) has completed the data writing process, and the (N+1)-th row of pixel circuits P(N+1) corresponding to the (N+1)-th write control signal SD(N+1) has not started the data writing process. Thus, the second voltage edge of the (N+2)-th reset control signal SV(N+2) can be prevented from being too late relative to the enable level of the N-th write control signal SD(N) and affecting the writing of the data signal into the (N+1)-th row of pixel circuits P(N+1).

Optionally, a time interval between the second voltage edge of the enable level of the (N+i+1)-th reset control signal SV(N+i+1) and a first voltage edge of the enable level of the (N+1)-th write control signal SD(N+1) is greater than a second threshold.

The second threshold refers to a time period for the potential of the data signal to return to the normal potential after being affected by the second voltage edge of the enable level of the reset control signal.

Figure 13:
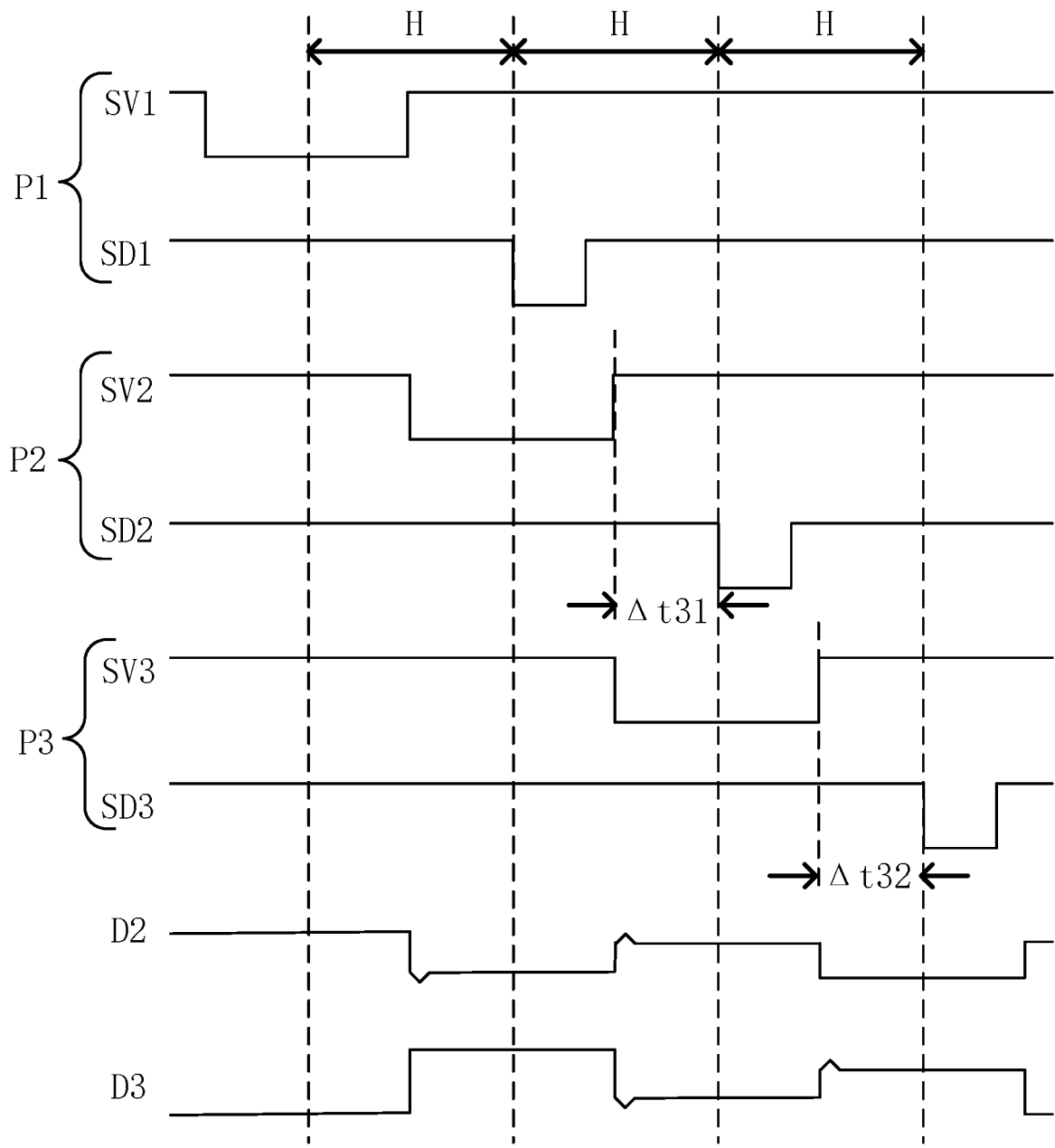
FIG. 13 is another drive timing graph of a display region according to an embodiment of the present disclosure.

For example, FIG. 13 is another drive timing graph of a display region according to an embodiment of the present disclosure. Referring to FIG. 13, the enable level is the low level, the first voltage edge is the falling edge, and the second voltage edge is the rising edge. When i=0 and N=1, the rising edge of the second reset control signal SV2 is after a rising edge of the first write control signal SD1 and before the falling edge of the second write control signal SD2, and a time interval Δt31 between the rising edge of the second reset control signal SV2 and the falling edge of the second write control signal SD2 is greater than the second threshold. When i=0 and N=2, the rising edge of the third reset control signal SV3 is after a rising edge of the second write control signal SD2 and before a falling edge of the third write control signal SD3, and a time interval Δt32 between the rising edge of the third reset control signal SV3 and the falling edge of the third write control signal SD3 is greater than the second threshold. After a relatively long time from when the second voltage edge of the (N+1)-th reset control signal SV(N+1) affects the (N+1)-th data signal D(N+1), the (N+1)-th row of pixel circuits P(N+1) corresponding to the (N+1)-th write control signal SD(N+1) starts the data writing process, and the affected (N+1)-th data signal D(N+1) has enough time to return to the normal potential. Thus, the second voltage edge of the (N+1)-th reset control signal SV(N+1) can be prevented from being too late relative to the enable level of the N-th write control signal SD(N), and the (N+1)-th data signal D(N+1) affected by the second voltage edge of the (N+1)-th reset control signal SV(N+1) can be prevented from being written into the (N+1)-th row of pixel circuits P(N+1) before returning to the normal potential.

Figure 14:
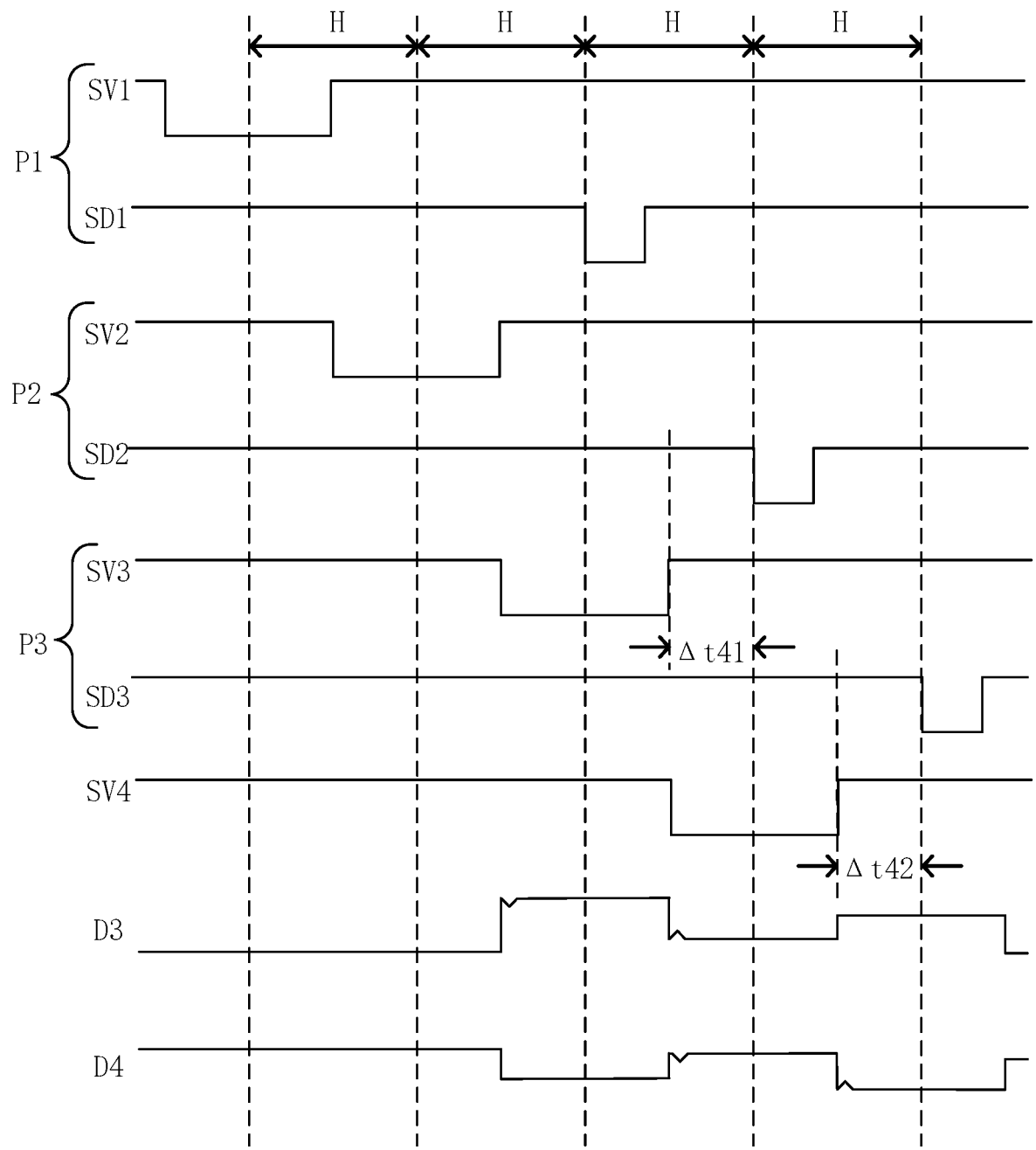
FIG. 14 is another drive timing graph of a display region according to an embodiment of the present disclosure.

FIG. 14 is another drive timing graph of a display region according to an embodiment of the present disclosure. Referring to FIG. 14, when i=1 and N=1, the rising edge of the third reset control signal SV3 is before the falling edge of the second write control signal SD2, and a time interval Δt41 between the rising edge of the third reset control signal SV3 and the falling edge of the second write control signal SD2 is greater than the second threshold. When i=1 and N=2, the rising edge of the fourth reset control signal SV4 is before the falling edge of the third write control signal SD3, and a time interval Δt42 between the rising edge of the fourth reset control signal SV4 and the falling edge of the third write control signal SD3 is greater than the second threshold. After a relatively long time from when the second voltage edge of the (N+2)-th reset control signal SV(N+2) affects the (N+2)-th data signal D(N+2), the (N+1)-th row of pixel circuits P(N+1) corresponding to the (N+1)-th write control signal SD(N+1) starts the data writing process, and the affected (N+2)-th data signal D(N+2) has enough time to return to the normal potential. Thus, the second voltage edge of the (N+2)-th reset control signal SV(N+2) can be prevented from being too late relative to the enable level of the N-th write control signal SD(N), and the (N+2)-th data signal D(N+2) affected by the second voltage edge of the (N+2)-th reset control signal SV(N+2) can be prevented from being written into the (N+1)-th row of pixel circuits P(N+1) before returning to the normal potential. It is to be understood that in contrast to that in FIG. 13, the reset control signal in FIG. 14 is moved forward by one unit duration H, the reset control signal in FIG. 14 may continue to be moved forward, and i may be other integers, which are not repeated one by one in the embodiments of the present disclosure.

Optionally, a write control signal provided for the (N−1)-th row of pixel circuits is denoted as an (N−1)-th write control signal, where N is greater than 1; where the first voltage edge of the enable level of the (N+i+1)-th reset control signal SV(N+i+1) is after an enable level of the (N−1)-th write control signal SD(N−1).

For example, the enable level is the low level, the first voltage edge is the falling edge, and the second voltage edge is the rising edge. Referring to FIG. 13, when i=0 and N=2, the falling edge of the third reset control signal SV3 is after the enable level of the first write control signal SD1 and before the enable level of the second write control signal SD2. Referring to FIG. 14, when i=1 and N=2, the falling edge of the fourth reset control signal SV4 is after the enable level of the first write control signal SD1 and before the enable level of the second write control signal SD2. When the first voltage edge of the (N+i+1)-th reset control signal SV(N+i+1) appears, the (N−1)-th row of pixel circuits P(N−1) has completed the data writing process, and the N-th row of pixel circuits P(N) has not started the data writing process. Thus, the first voltage edge of the (N+i+1)-th reset control signal SV(N+i+1) can be prevented from being too early relative to the enable level of the N-th write control signal SD(N) and affecting the writing of the data signal into the (N−1)-th row of pixel circuits P(N−1).

Optionally, the data line provides the data signal; and one period in which the data signal is located coincides with a period in which an enable level of one write control signal is located.

Figure 15:
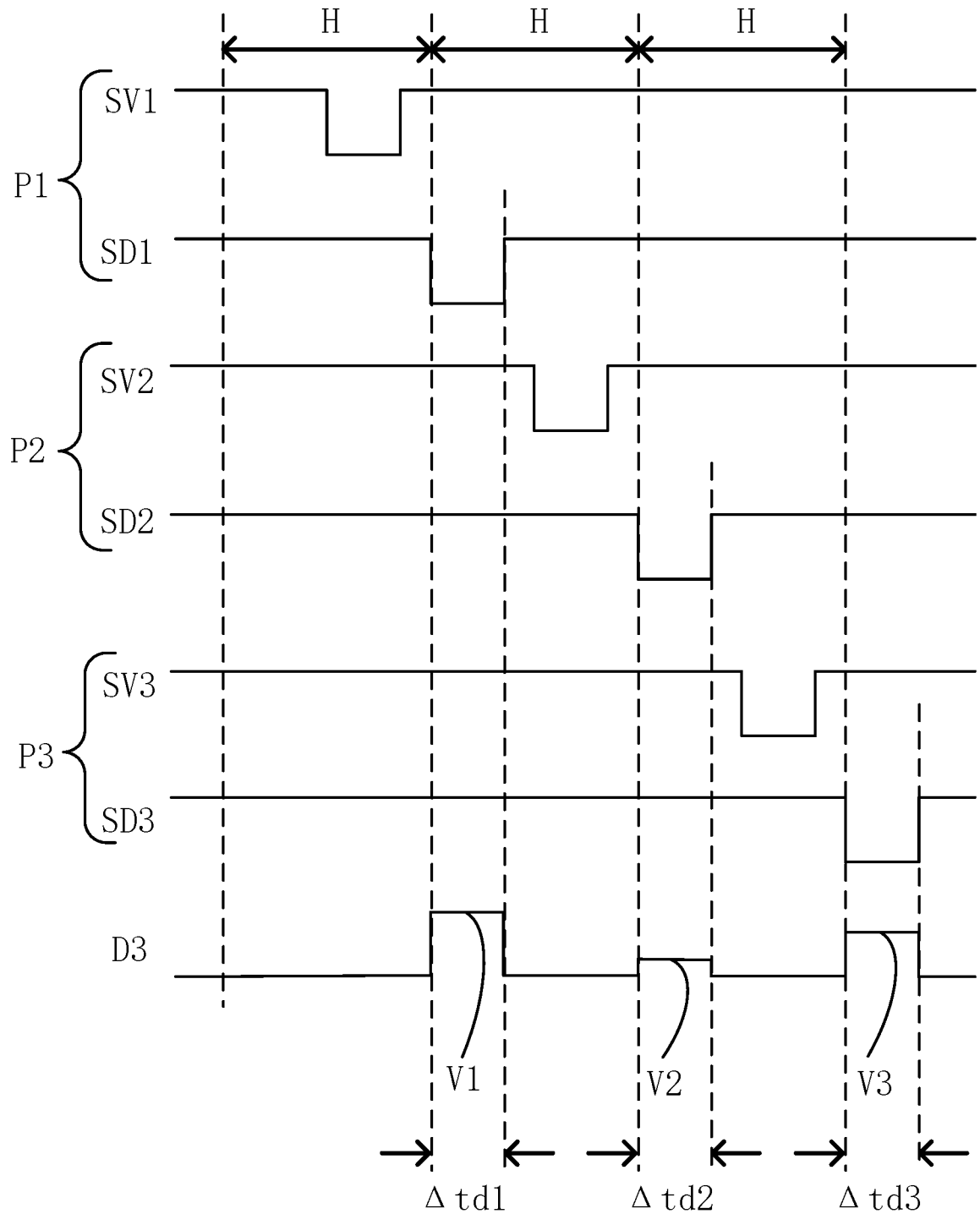
FIG. 15 is another drive timing graph of a display region according to an embodiment of the present disclosure.

For example, FIG. 15 is another drive timing graph of a display region according to an embodiment of the present disclosure. Referring to FIG. 15, the enable level is the low level, for example. The data line DL in the third column and electrically connected to the third column of pixel circuits 01 provides the third data signal D3 for the third column of pixel circuits 01, and the third data signal D3 includes a plurality of effective periods such as a first effective period Δtd1, a second effective period Δtd2, and a third effective period Δtd3. The first effective period Δtd1 of the third data signal D3 is also a period of the enable level of the first write control signal SD1, a control chip writes an effective electrical signal with a potential of V1 to the data line DL in the third column, and the first row of pixel circuits P1 writes the third data signal D3 with the potential of V1 to the gate of the drive transistor. The second effective period Δtd2 of the third data signal D3 is also a period of the enable level of the second write control signal SD2, the control chip writes an effective electrical signal with a potential of V2 to the data line DL in the third column, and the second row of pixel circuits P2 writes the third data signal D3 with the potential of V2 to the gate of the drive transistor. The third effective period Δtd3 of the third data signal D3 is also a period of the enable level of the third write control signal SD3, the control chip writes an effective electrical signal with a potential of V3 to the data line DL in the third column, and the third row of pixel circuits P3 writes the third data signal D3 with the potential of V3 to the gate of the drive transistor. Outside the effective periods of the third data signal D3, the control chip stops writing an electrical signal to the data line DL in the third column. Similarly, another data signal includes the same effective period as the third data signal D3, which coincides with an enable level of one write control signal. Thus, the first voltage edge and/or the second voltage edge of the enable level of the (N+i+1)-th reset control signal SV(N+i+1) is outside the effective period of the data signal, especially the effective period of an (N+i+1)-th data signal D(N+i+1) so that an effect of the reset control signal on the data signal can be reduced.

Figure 16:
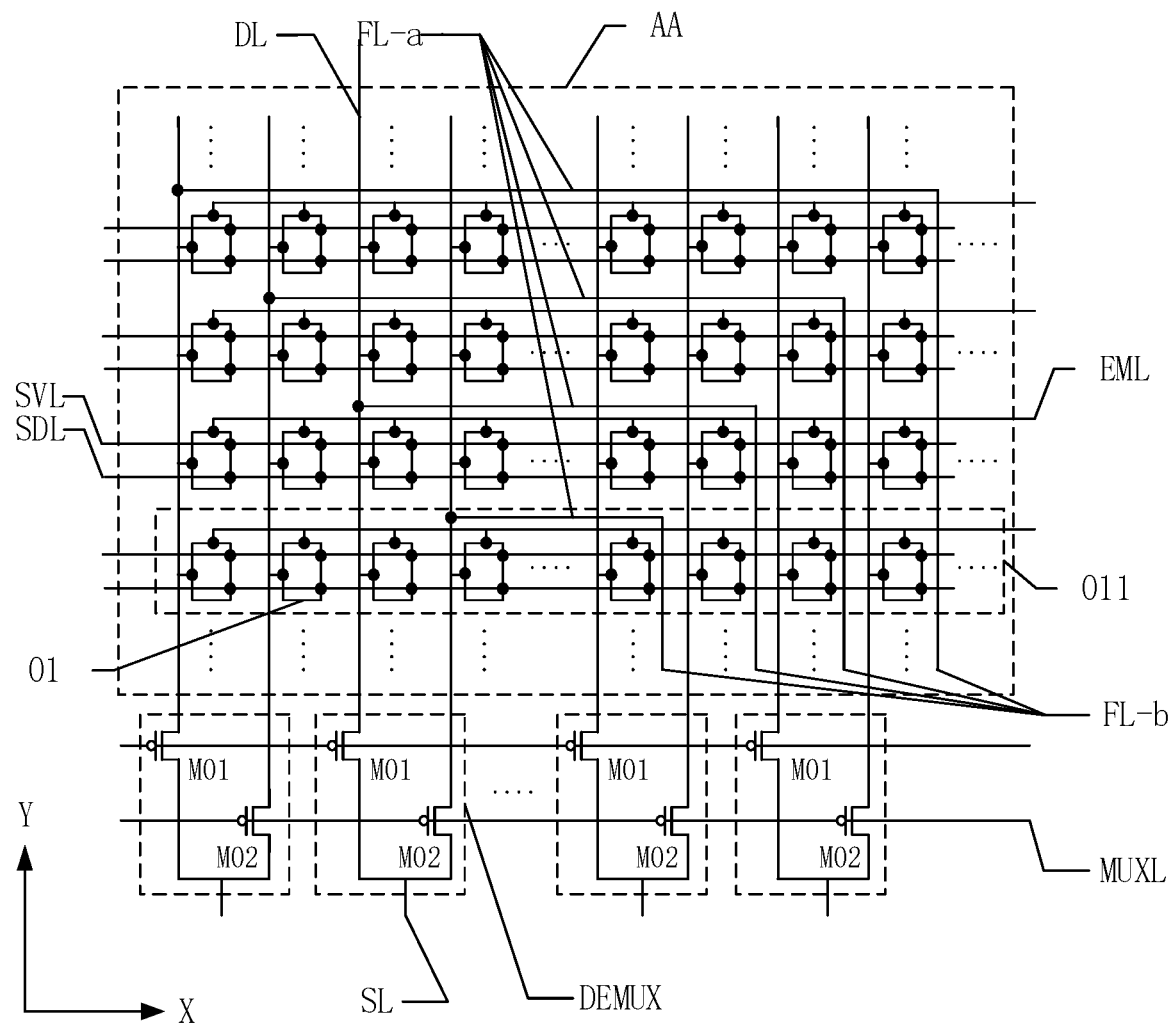
FIG. 16 is a top view of a display panel according to an embodiment of the present disclosure.
Figure 17:
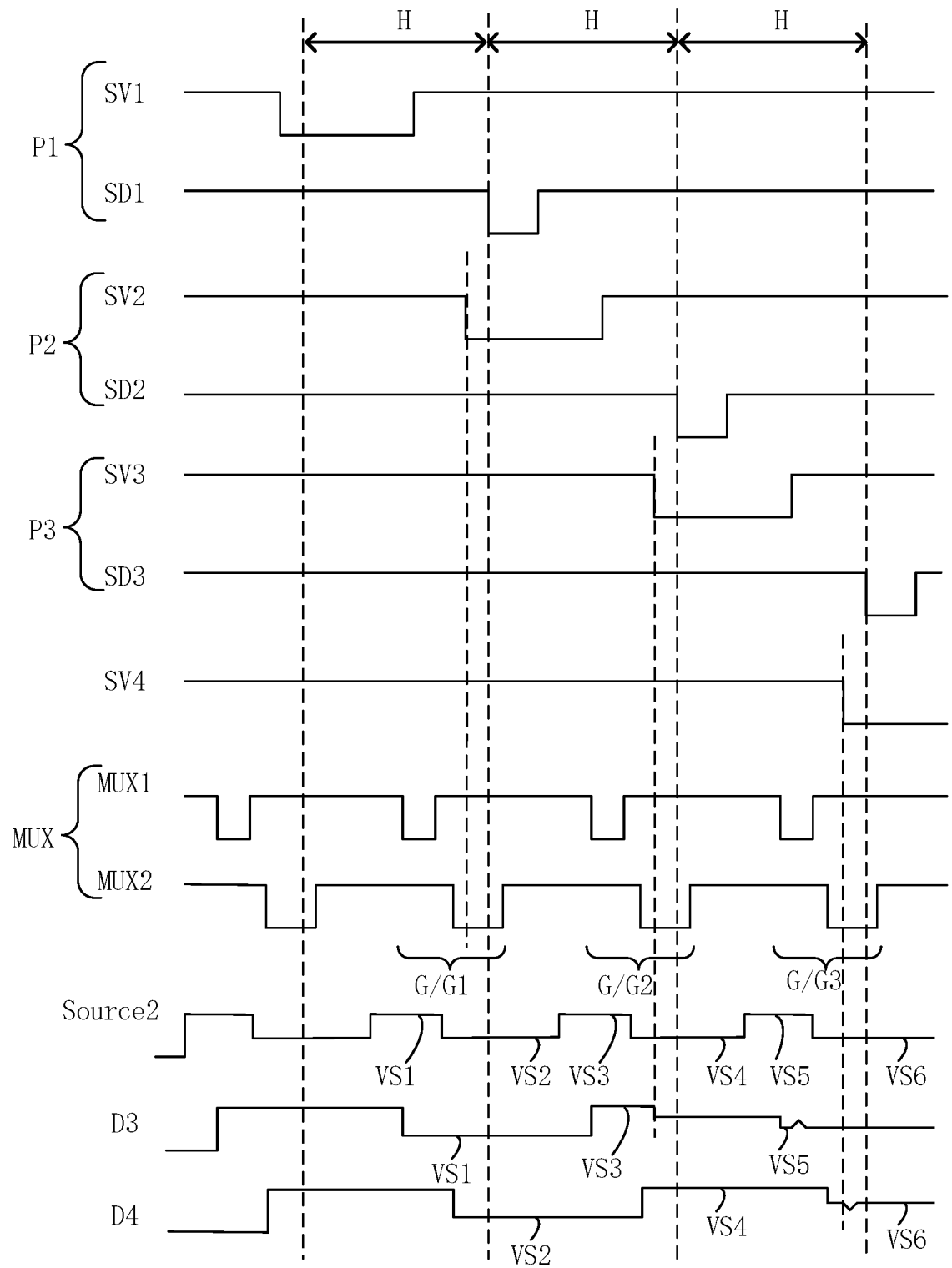
FIG. 17 is another drive timing graph of a display panel according to an embodiment of the present disclosure.

Optionally, FIG. 16 is a top view of a display panel according to an embodiment of the present disclosure, and FIG. 17 is a drive timing graph of a display panel according to an embodiment of the present disclosure. Referring to FIGS. 16 and 17, the display panel further includes gating units DEMUX and at least two gating control lines MUXL. In an embodiment, the gating units DEMUX and the gating control lines MUXL are disposed in the non-display region outside the display region AA. Output terminals of the gating units DEMUX are electrically connected to the plurality of data lines DL, and control terminals of the gating units DEMUX are electrically connected to the at least two gating control lines MUXL. The at least two gating control lines MUXL are configured to provide gating control signals MUX to a gating unit DEMUX, and the gating unit DEMUX is controlled by an enable level of one of the gating control signals MUX transmitted by the at least two gating control lines MUXL to make an input terminal of the gating unit DEMUX connected to and conducted with one of a plurality of output terminals of the gating unit DEMUX. Enable levels of the gating control signals MUX transmitted by the at least two gating control lines MUXL constitute a gating control signal group G.

A gating control signal group provided for the N-th row of pixel circuits P(N) is denoted as an N-th gating control signal group G(N), and the N-th gating control signal group G(N) is before a second voltage edge of the enable level of the N-th write control signal SD(N) so that signals are written into a data line DL in an odd column and a data line DL in an even column before the N-th write control signal SD(N) controls the N-th row of pixel circuits P(N) to perform the process of writing the data signal. In an embodiment, after data signals are written into the data line DL in the odd column and the data line DL in the even column, the data line DL in the odd column and the data line DL in the even column may be written into the N-th row of pixel circuits P(N). Specifically, the data signal may be written into the gate of the drive transistor M3 in the N-th row of pixel circuits P(N). In another embodiment, a period during which the data signals are written into the data lines DL may overlap a period during which the data signals on the data lines DL are written into the N-th row of pixel circuits P(N).

For example, referring to FIG. 17, the gating control signal group G includes a first gating control signal group G1, a second gating control signal group G2, and a third gating control signal group G3. The first gating control signal group G1 is before a second voltage edge of the enable level of the first write control signal SD1. Before the process of writing the data signal into the first row of pixel circuits P1 corresponding to the first write control signal SD1 ends, the corresponding source signal has been written into the data line DL in the odd column and the data line DL in the even column separately, which are updated to the data signals provided for the first row of pixel circuits P1. The source signal includes a second source signal Source2. For example, for the second gating unit DEMUX, a second source signal Source2 with a potential of VS1 and a second source signal Source2 with a potential of VS2 have been written into the data line DL in the third column and the data line DL in the fourth column respectively through the first gating control signal group G1. Similarly, before the process of writing the data signal into the second row of pixel circuits P2 corresponding to the second write control signal SD2 ends, a second source signal Source2 with a potential of VS3 and a second source signal Source2 with a potential of VS4 have been written into the data line DL in the third column and the data line DL in the fourth column respectively through the second gating control signal group G2; before the process of writing the data signal into the third row of pixel circuits P3 corresponding to the third write control signal SD3 ends, a second source signal Source2 with a potential of VS5 and a second source signal Source2 with a potential of VS6 have been written into the data line DL in the third column and the data line DL in the fourth column respectively through the third gating control signal group G3.

The first voltage edge of the enable level of the (N+i+1)-th reset control signal SV(N+i+1) is before a second voltage edge of an enable level of the last gating control signal MUX arranged in chronological order in the N-th gating control signal group G(N). In this manner, since the input terminal of the gating unit DEMUX is connected to and conducted with one of the plurality of output terminals of the gating unit DEMUX in the period of the enable level of the gating control signal MUX, a coupled voltage value of the data line DL caused by the first voltage edge of the enable level of the (N+i+1)-th reset control signal SV(N+i+1) is pulled by a driver chip to a normal voltage value or overwritten with a voltage value, thereby reducing a voltage deviation of the data signal written into the data line DL. Therefore, the voltage deviation of the data signal written by the data line DL into the N-th row of pixel circuits P(N) can be reduced, thereby facilitating the writing of the accurate data signal into each pixel circuit and improving the display effect of the display panel.

For example, with continued reference to FIG. 17, the gating control signals MUX include a first gating control signal MUX1 and a second gating control signal MUX2. When i=0 and N=1, a first voltage edge of an enable level of the second reset control signal SV2 is before a second voltage edge of an enable level of the second gating control signal MUX2 in the first gating control signal group G1. A coupled voltage value (that is, a voltage value fluctuating due to coupling) of the fourth data signal D4 caused by the first voltage edge of the enable level of the second reset control signal SV2 is pulled by the driver chip to a normal voltage value.

For example, with continued reference to FIG. 17, the display panel includes two gating control lines MUXL, the enable level is the low level, the first voltage edge is the falling edge, and the second voltage edge is the rising edge. When i=0 and N=1, the falling edge of the second reset control signal SV2 overlaps the enable level of the second gating control signal MUX2 in the first gating control signal group G1. When i=0 and N=2, the falling edge of the third reset control signal SV3 overlaps the enable level of the second gating control signal MUX2 in the second gating control signal group G2. When i=0 and N=3, the falling edge of the fourth reset control signal SV4 overlaps the enable level of the second gating control signal MUX2 in the third gating control signal group G3. For example, for the second gating unit DEMUX, when a first voltage edge of the fourth reset control signal SV4 affects the fourth data signal D4, a second gating transistor M02 is in an on state and is writing the source signal into the data line DL in the fourth column, and the affected fourth data signal D4 may be pulled to a normal potential of VS6 in a short time. Thus, at least an effect of the (N+i+1)-th reset control signal SV(N+i+1) on the source signal written into the data line DL in the even column can be reduced, thereby improving the display effect of the display panel.

Figure 18:
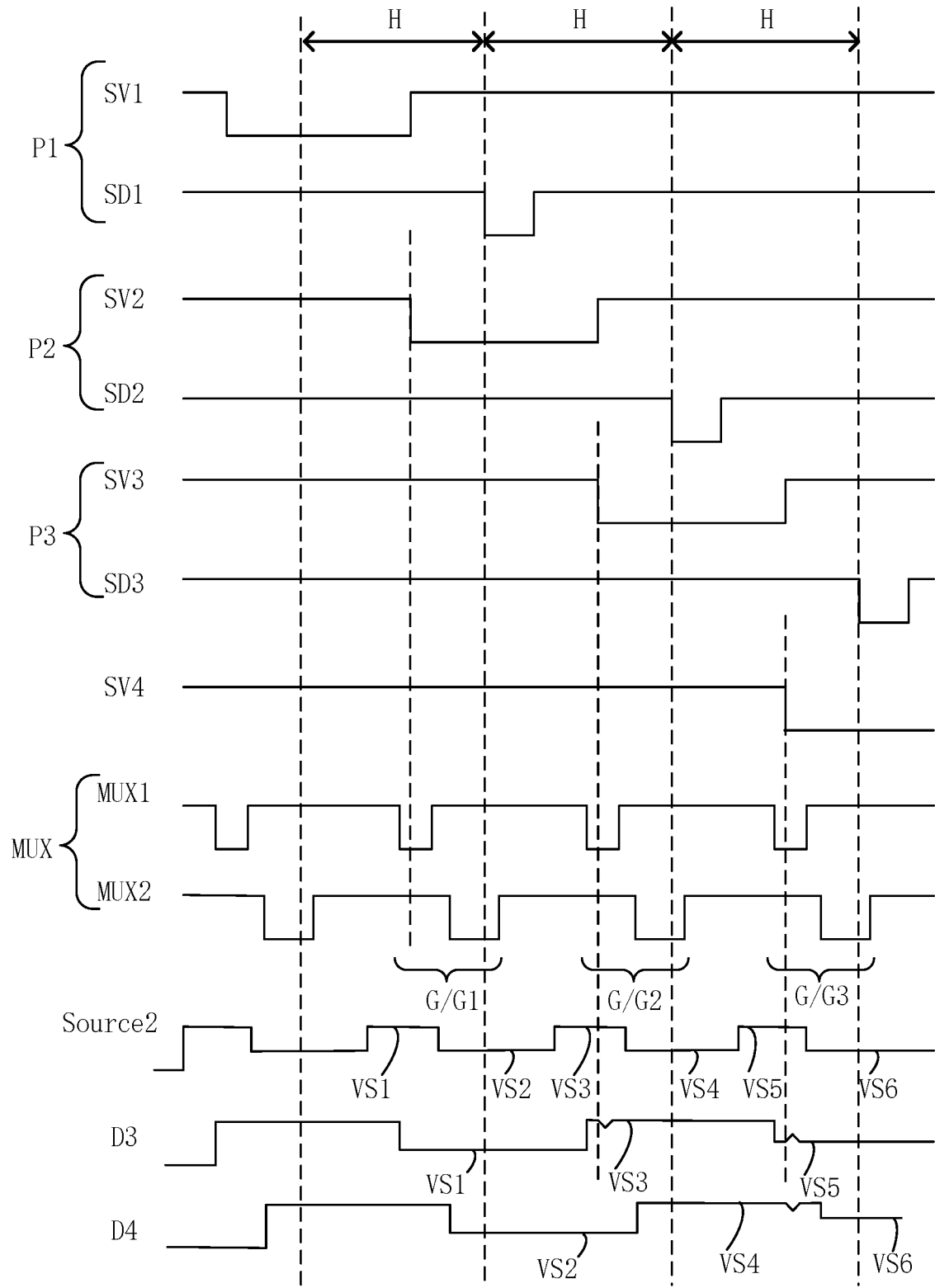
FIG. 18 is another drive timing graph of a display panel according to an embodiment of the present disclosure.

In an embodiment, the first voltage edge of the enable level of the (N+i+1)-th reset control signal SV(N+i+1) is before a second voltage edge of an enable level of the first gating control signal MUX arranged in chronological order in the N-th gating control signal group G(N). FIG. 18 is another drive timing graph of a display panel according to an embodiment of the present disclosure. Referring to FIG. 18, the display panel includes two gating control lines MUXL, the enable level is the low level, the first voltage edge is the falling edge, and the second voltage edge is the rising edge, for example. When i=0 and N=1, the falling edge of the second reset control signal SV2 overlaps an enable level of the first gating control signal MUX1 in the first gating control signal group G1. When i=0 and N=2, the falling edge of the third reset control signal SV3 overlaps the enable level of the first gating control signal MUX1 in the second gating control signal group G2. When i=0 and N=3, the falling edge of the fourth reset control signal SV4 overlaps the enable level of the first gating control signal MUX1 in the third gating control signal group G3. For example, for the second gating unit DEMUX, when a first voltage edge of the third reset control signal SV3 affects the third data signal D3, a first gating transistor M01 is in the on state and is writing the second source signal Source2 into the data line DL in the third column, and the affected third data signal D3 may be pulled to a normal potential of VS3 in a short time; at this time, the second gating transistor M02 is in an off state, and the second source signal Source2 with a potential of VS4 and provided for the N-th row of pixel circuits P(N) has not been written into the data line DL in the fourth column. When the second gating transistor M02 is turned on, the second source signal Source2 with a potential of VS4 may be normally written into the data line DL in the fourth column so that the third data signal D3 and the fourth data signal D4 relatively accurate can be written into the N-th row of pixel circuits P(N). Thus, an effect of the (N+i+1)-th reset control signal SV(N+i+1) on the source signal written into the data line DL can be reduced, thereby improving the display effect of the display panel.

Figure 19:
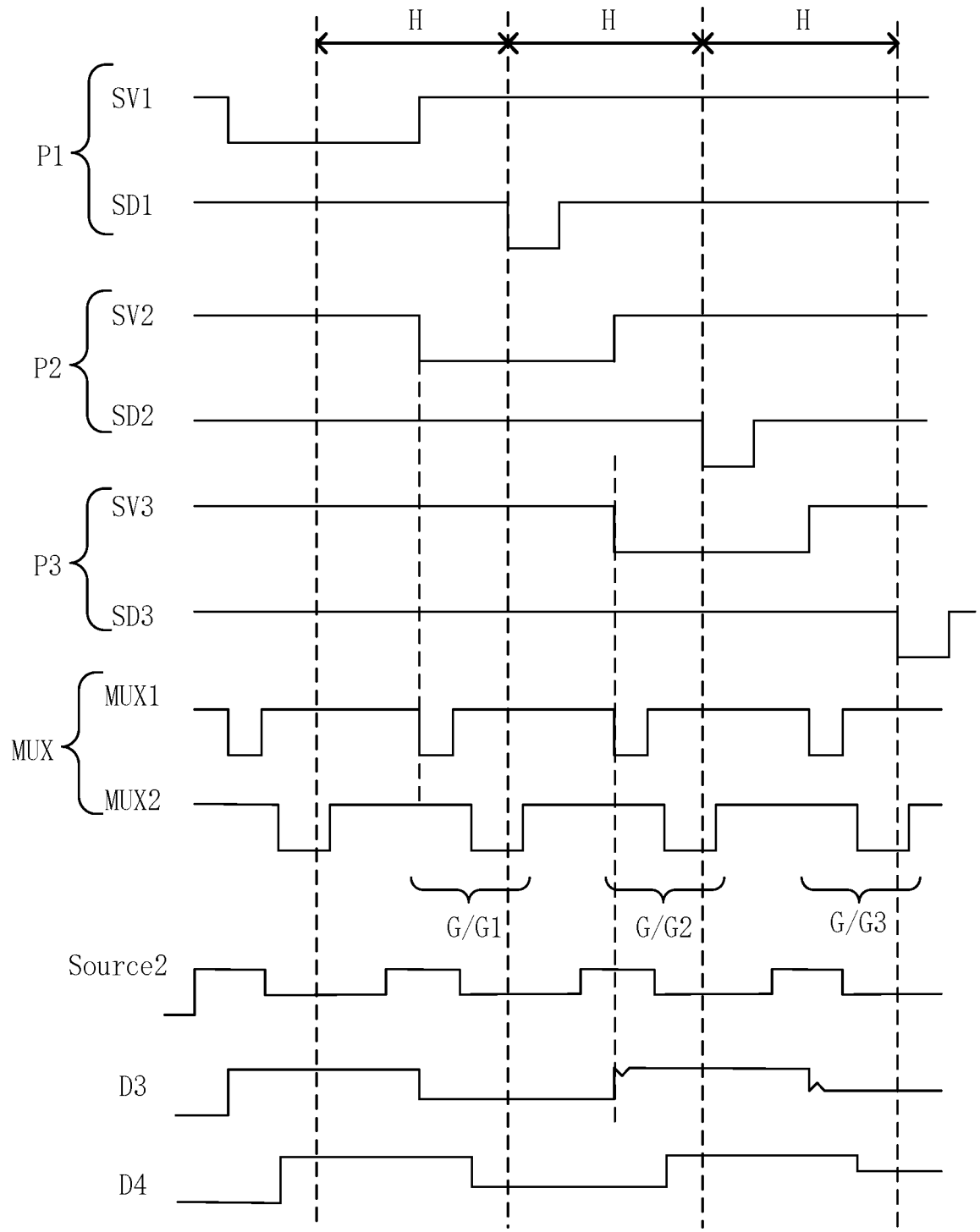
FIG. 19 is another drive timing graph of a display panel according to an embodiment of the present disclosure.

In an embodiment, the first voltage edge of the enable level of the (N+i+1)-th reset control signal SV(N+i+1) coincides with a first voltage edge of the enable level of the first gating control signal MUX arranged in chronological order in the N-th gating control signal group G(N). FIG. 19 is another drive timing graph of a display panel according to an embodiment of the present disclosure. Referring to FIG. 19, the display panel includes two gating control lines MUXL, the enable level is the low level, the first voltage edge is the falling edge, and the second voltage edge is the rising edge, for example. When i=0 and N=1, the falling edge of the second reset control signal SV2 coincides with a falling edge of the first gating control signal MUX1 in the first gating control signal group G1. When i=0 and N=2, the falling edge of the third reset control signal SV3 coincides with the falling edge of the first gating control signal MUX1 in the second gating control signal group G2. In this manner, the third data signal D3 and the fourth data signal D4 relatively accurate can be written into the N-th row of pixel circuits P(N), thereby improving the display effect of the display panel. It is to be understood that the reset control signal in FIG. 19 may be moved forward by i unit durations H, and i may be other integers, which are not repeated one by one in the embodiments of the present disclosure.

Optionally, the first voltage edge of the enable level of the (N+i+1)-th reset control signal SV(N+i+1) is before the first voltage edge of the enable level of the first gating control signal MUX arranged in chronological order in the N-th gating control signal group G(N). The first voltage edge of the enable level of the (N+i+1)-th reset control signal SV(N+i+1) is before the N-th gating control signal group G(N). In this manner, the coupled voltage value of the data line DL caused by the first voltage edge of the enable level of the (N+i+1)-th reset control signal SV(N+i+1) is overwritten with a voltage value written in a period of the N-th gating control signal group G(N), thereby reducing the voltage deviation of the data signal written into the data line DL. Therefore, the voltage deviation of the data signal written by the data line DL into the N-th row of pixel circuits P(N) can be reduced, thereby facilitating the writing of the accurate data signal into each pixel circuit and improving the display effect of the display panel.

Figure 20:
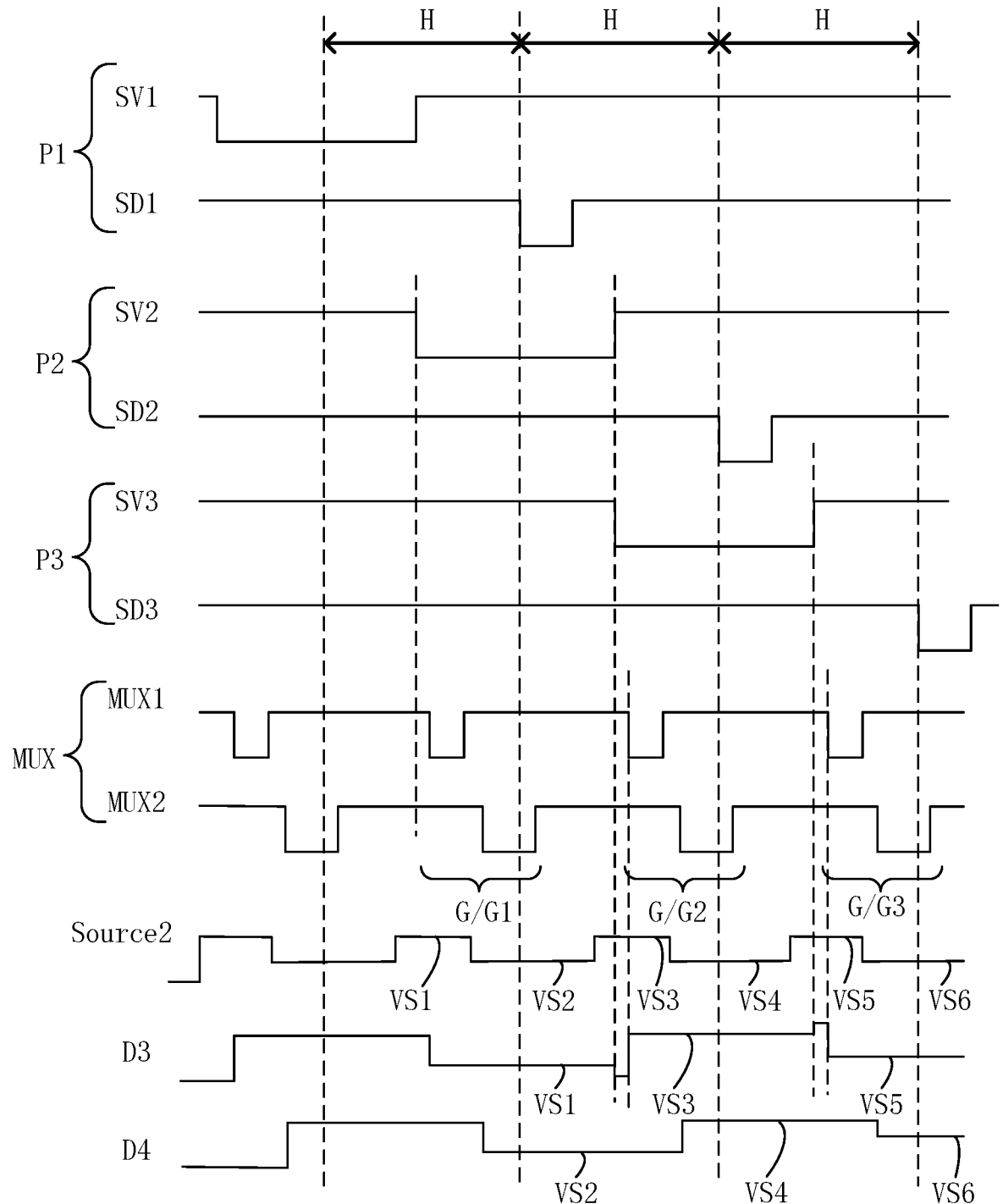
FIG. 20 is another drive timing graph of a display panel according to an embodiment of the present disclosure.

For example, FIG. 20 is another drive timing graph of a display panel according to an embodiment of the present disclosure. Referring to FIG. 20, the display panel includes two gating control lines MUXL, the enable level is the low level, the first voltage edge is the falling edge, and the second voltage edge is the rising edge, for example. When i=0 and N=1, the falling edge of the second reset control signal SV2 is before the falling edge of the first gating control signal MUX1 in the first gating control signal group G1. When i=0 and N=2, the falling edge of the third reset control signal SV3 is before the falling edge of the first gating control signal MUX1 in the second gating control signal group G2. For example, for the second gating unit DEMUX, when the first voltage edge of the third reset control signal SV3 affects the third data signal D3, the first gating transistor M01 and the second gating transistor M02 are in the off state, the second source signal Source2 has not been written into the data line DL in the third column, and the first voltage edge of the third reset control signal SV3 does not affect the writing of the second source signal Source2 into the data line DL in the third column. When the first gating transistor M01 is turned on, the second source signal Source2 with a potential of VS3 may be normally written into the data line DL in the third column, an abnormal third data signal D3 is overwritten, and the accurate third data signal D3 with a potential of VS3 may be written into the second row of pixel circuits P2. Similarly, when the second gating transistor M02 is turned on, the accurate fourth data signal D4 may be written into the second row of pixel circuits P2. Thus, the first voltage edge of the (N+1)-th reset control signal SV(N+1) is before the first voltage edge of the first gating control signal MUX1 in the N-th gating control signal group so that an effect of the first voltage edge of the (N+1)-th reset control signal SV(N+1) on the source signal written into the data line DL can be avoided, the accuracy of the data signal written into the N-th row of pixel circuits P(N) can be ensured, and the display effect of the display panel can be improved.

Optionally, the write control signal provided for the (N+1)-th row of pixel circuits is denoted as the (N+1)-th write control signal SD(N+1), and a gating control signal group provided for the (N+1)-th row of pixel circuits is denoted as an (N+1)-th gating control signal group G(N+1). The second voltage edge of the enable level of the (N+i+1)-th reset control signal SV(N+i+1) is after the enable level of the N-th write control signal and before the (N+1)-th gating control signal group G(N+1).

For example, with continued reference to FIG. 20, the display panel includes two gating control lines MUXL, the enable level is the low level, the first voltage edge is the falling edge, and the second voltage edge is the rising edge. When i=0 and N=1, the rising edge of the second reset control signal SV2 is after the enable level of the first write control signal SD1 and before the second gating control signal group G2. When i=0 and N=2, the rising edge of the third reset control signal SV3 is after the enable level of the second write control signal SD2 and before the third gating control signal group G3. For example, for the second gating unit DEMUX, when a second voltage edge of the third reset control signal SV3 affects the third data signal D3, the second source signal Source2 with a potential of VS5 and provided for the third row of pixel circuits P3 has not been written into the data line DL in the third column, and a second source signal Source2 with a potential of VS6 and provided for the third row of pixel circuits P3 has not been written into the data line DL in the fourth column. When the first gating transistor M01 is turned on, the second source signal Source2 with a potential of VS5 may be normally written into the data line DL in the third column, the abnormal third data signal D3 is overwritten, and the accurate third data signal D3 with a potential of VS5 may be written into the third row of pixel circuits P3. Similarly, when the second gating transistor M02 is turned on, the accurate fourth data signal D4 may be written into the third row of pixel circuits P3. Thus, the second voltage edge of the (N+1)-th reset control signal SV(N+1) can be prevented from being too late relative to the enable level of the N-th write control signal SD(N) and affecting the writing of the source signal into the data line DL by the gating unit DEMUX under the control of the (N+1)-th gating control signal group G(N+1) so that the abnormal data signal D can be avoided, thereby improving the accuracy of the data signal written into the (N+1)-th row of pixel circuits P(N+1).

Figure 21:
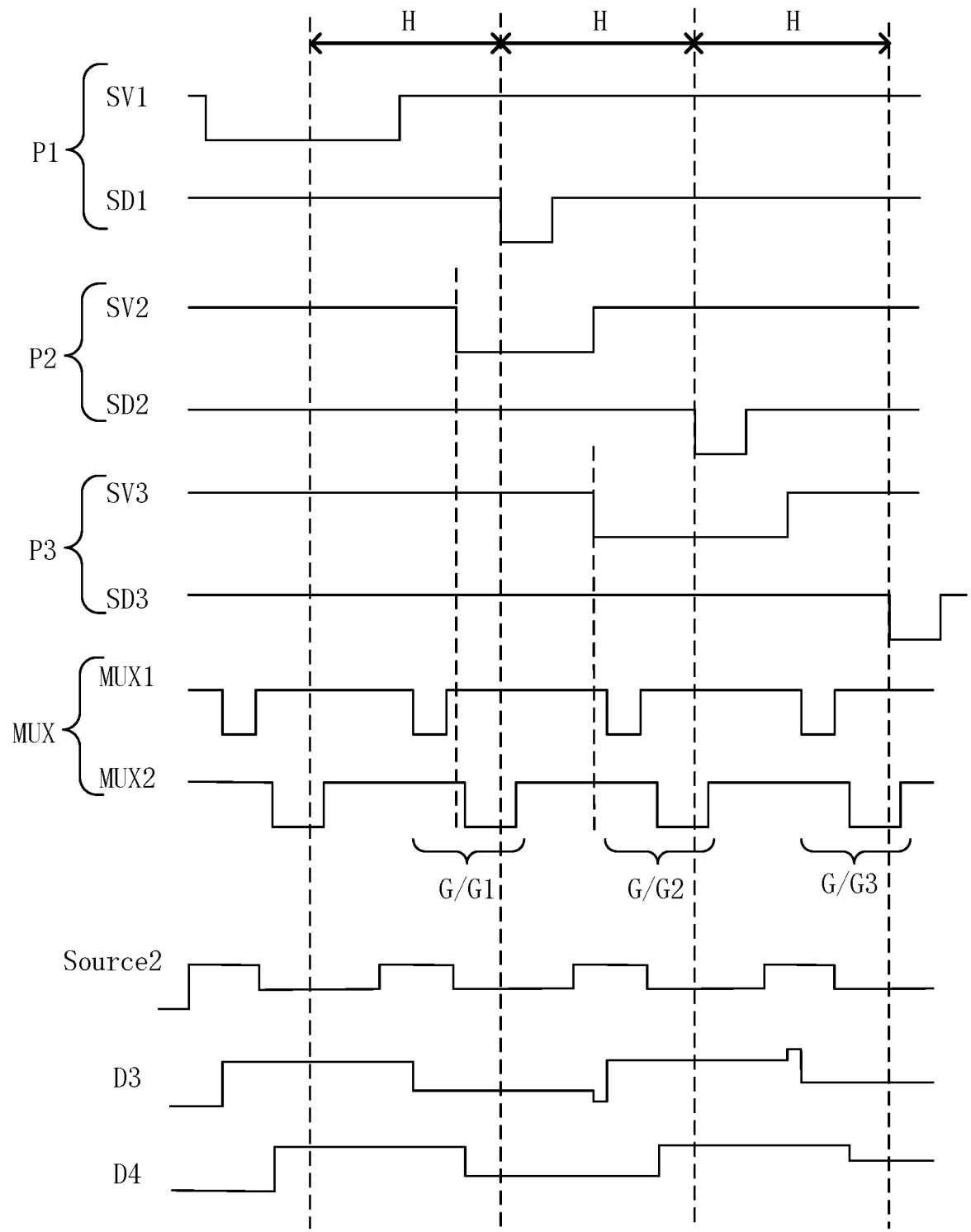
FIG. 21 is another drive timing graph of a display panel according to an embodiment of the present disclosure.

FIG. 21 is another drive timing graph of a display panel according to an embodiment of the present disclosure. Referring to FIG. 21, at least two gating control signals include the first gating control signal MUX1 and the second gating control signal MUX2, and in the same gating control signal group G, the enable level of the first gating control signal MUX1 is before the enable level of the second gating control signal MUX2. If N+i+1 is an odd number, the display panel satisfies that the first voltage edge of the enable level of the (N+i+1)-th reset control signal SV(N+i+1) is before a first voltage edge of the enable level of the first gating control signal MUX1 in the N-th gating control signal group G(N). If N+i+1 is an even number, the display panel satisfies that the first voltage edge of the enable level of the (N+i+1)-th reset control signal SV(N+i+1) is between the enable level of the first gating control signal MUX1 and the enable level of the second gating control signal MUX2 in the N-th gating control signal group.

For example, referring to FIG. 21, the display panel includes two gating control lines MUXL, the enable level is the low level, the first voltage edge is the falling edge, and the second voltage edge is the rising edge. When i=0 and N=1, the falling edge of the second reset control signal SV2 is between the enable level of the first gating control signal MUX1 and the enable level of the second gating control signal MUX2 in the first gating control signal group. When i=0 and N=2, the falling edge of the third reset control signal SV3 is before the falling edge of the first gating control signal MUX1 in the second gating control signal group.

In an embodiment, reset control lines SVL in odd rows are electrically connected to shift registers cascaded in sequence in the same group separately and configured to provide reset control signals with the same enable level period for pixel circuits in the odd rows. Reset control lines SVL in even rows are electrically connected to shift registers cascaded in sequence in the other group separately and configured to provide reset control signals with the same enable level period for pixel circuits in the even rows. The enable level period of the reset control signals for the odd rows is greater than the enable level period of the reset control signals for the even rows. The second voltage edge of the enable level of the (N+i+1)-th reset control signal SV(N+i+1) for the odd row and the even row is after the enable level of the N-th write control signal SD(N) and before the (N+1)-th gating control signal group G(N+1).

When the first voltage edge of the reset control signal for the odd row affects the data signal on the data line DL in the odd column, the data signal (that is, the source signal) provided for pixel circuits in the odd row has not been written into the data line DL in the odd column. When the first voltage edge of the reset control signal for the even row affects the data signal on the data line DL in the even column, the data signal provided for pixel circuits in the even row has not been written into the data line DL in the even column. Thus, an effect of the first voltage edge of the reset control signal for the odd row on the process of writing the source signal into the data line DL in the odd column and an effect of the first voltage edge of the reset control signal for the even row on the process of writing the source signal into the data line DL in the even column can be reduced, thereby improving the accuracy of the data signal written to the pixel circuit 01.

Figure 22:
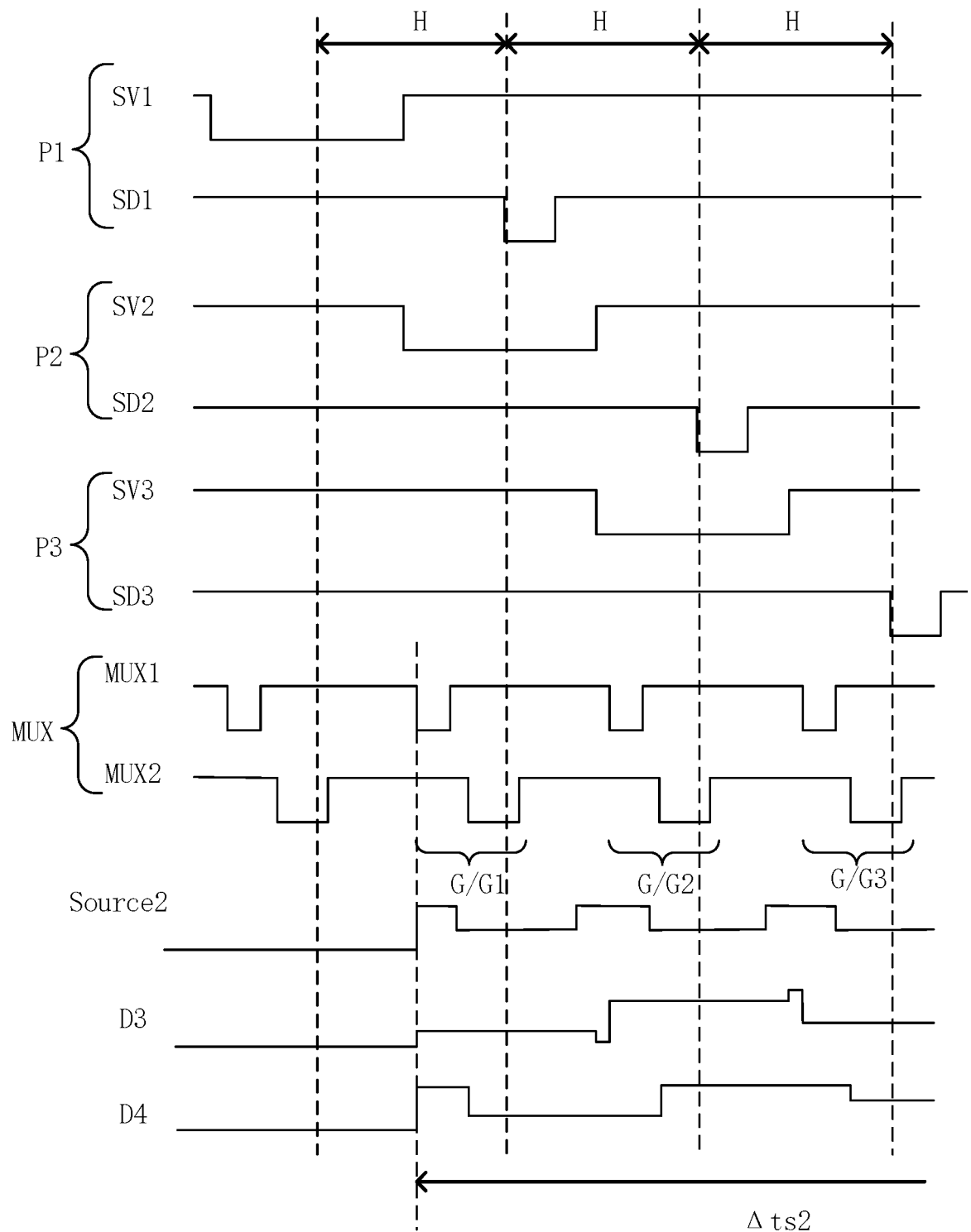
FIG. 22 is another drive timing graph of a display panel according to an embodiment of the present disclosure.

In an optional embodiment, a starting moment of a period where the source signal on each signal source line SL is located coincides with the first voltage edge of the enable level of the first gating control signal arranged in chronological order in the first gating control signal group G1. FIG. 22 is another drive timing graph of a display panel according to an embodiment of the present disclosure. Referring to FIG. 22, the display panel includes two gating control lines MUXL, and the enable level is the low level, for example. The second signal source line SL electrically connected to an input terminal of the second gating unit DEMUX provides the second source signal Source2 for the second gating unit DEMUX, and the second source signal Source2 includes a second source effective period $\Delta ts2$. Before the second source effective period $\Delta ts2$, the control chip provides no effective electrical signal for the second signal source line SL, and no effective electrical signal is written into the data line DL in the third column and the data line DL in the fourth column. In this manner, low power consumption of the display panel is facilitated.

Optionally, referring to FIG. 16, the display panel further includes the signal source line SL, where one end of the signal source line SL is coupled to the input terminal of the gating unit DEMUX, and the other end of the signal source line SL is coupled to the control chip (not shown in FIG. 16) through the fan-out wire. Each output terminal of the gating unit DEMUX is coupled to one data line DL, and under the control of the gating control signal group G, the gating unit DEMUX may write the source signal on the signal source line SL into one data line DL through one output terminal of the gating unit DEMUX. The source signal provided for the K-th gating unit DEMUX is denoted as a K-th source signal Source(K), where K is a positive integer.

For example, referring to FIG. 16, the display panel includes two gating control lines MUXL. However, this is not a limitation. In other embodiments, the display panel may further include another number of gating control lines MUXL. The gating unit DEMUX includes the first gating transistor M01 and the second gating transistor M02, and the gating control lines MUXL include a first gating control line MUXL1 and a second gating control line MUXL2. A first terminal of the first gating transistor M01 and a first terminal of the second gating transistor M02 are electrically connected to the signal source line SL. A second terminal of the first gating transistor M01 is electrically connected to an odd data line DL, and a gate of the first gating transistor M01 is electrically connected to the first gating control line MUXL1. A second terminal of the second gating transistor M02 is electrically connected to an even data line DL, and a gate of the second gating transistor M02 is electrically connected to the second gating control line MUXL2.

The gating control signal MUX provided for the first gating transistor M01 is denoted as the first gating control signal MUX1, and the gating control signal MUX provided for the second gating transistor M02 is denoted as the second gating control signal MUX2. When the first gating control signal MUX1 is at the enable level and the second gating control signal MUX2 is at the disable level, the first gating transistor M01 in the gating unit DEMUX is turned on, and the K-th source signal Source(K) is written into a data line DL in the (2K−1)-th column. When the second gating control signal MUX2 is at the enable level and the first gating control signal MUX1 is at the disable level, the second gating transistor M02 in the gating unit DEMUX is turned on, and the K-th source signal Source(K) is written into a data line DL in the 2K-th column.

Optionally, referring to FIG. 16, the display region AA includes a plurality of row display regions 011 arranged along the second direction Y, and each row display region 011 includes pixel circuits 01 in the same row; and in the same row display region 011, the reset control line SVL is disposed between the first connection wire segment FL-a and the signal write control line SDL along the second direction Y.

For example, when the write control signal on the signal write control line SDL in the row display region 011 jumps to control the data signals on the data lines DL to be written to the pixel circuits 01 in the row display region 011, the jump of the write control signal may couple a potential of the first connection wire segment FL-a in the row display region 011; thus, the data signal on the data line DL electrically connected to the first connection wire segment FL-a in the row display region 011 changes, and the abnormal data signal is written to the row display region 011. When the data signals on the data lines DL are written to the pixel circuits 01 in the row display region 011, the pixel circuits 01 in the row display region 011 have reset the gate of the drive transistor M3, and the reset control signal on the reset control line SVL in the row display region 011 is at the disable level so that the reset control signal on the reset control line SVL is relatively stable. In any row display region 011, the reset control line SVL is disposed between the first connection wire segment FL-a and the signal write control line SDL along the second direction Y so that the coupling of the potential of the first connection wire segment FL-a by the jump of the write control signal on the signal write control line SDL can be reduced during the data writing of the row display region 011, thereby improving the accuracy of the data signal.

Figure 23:
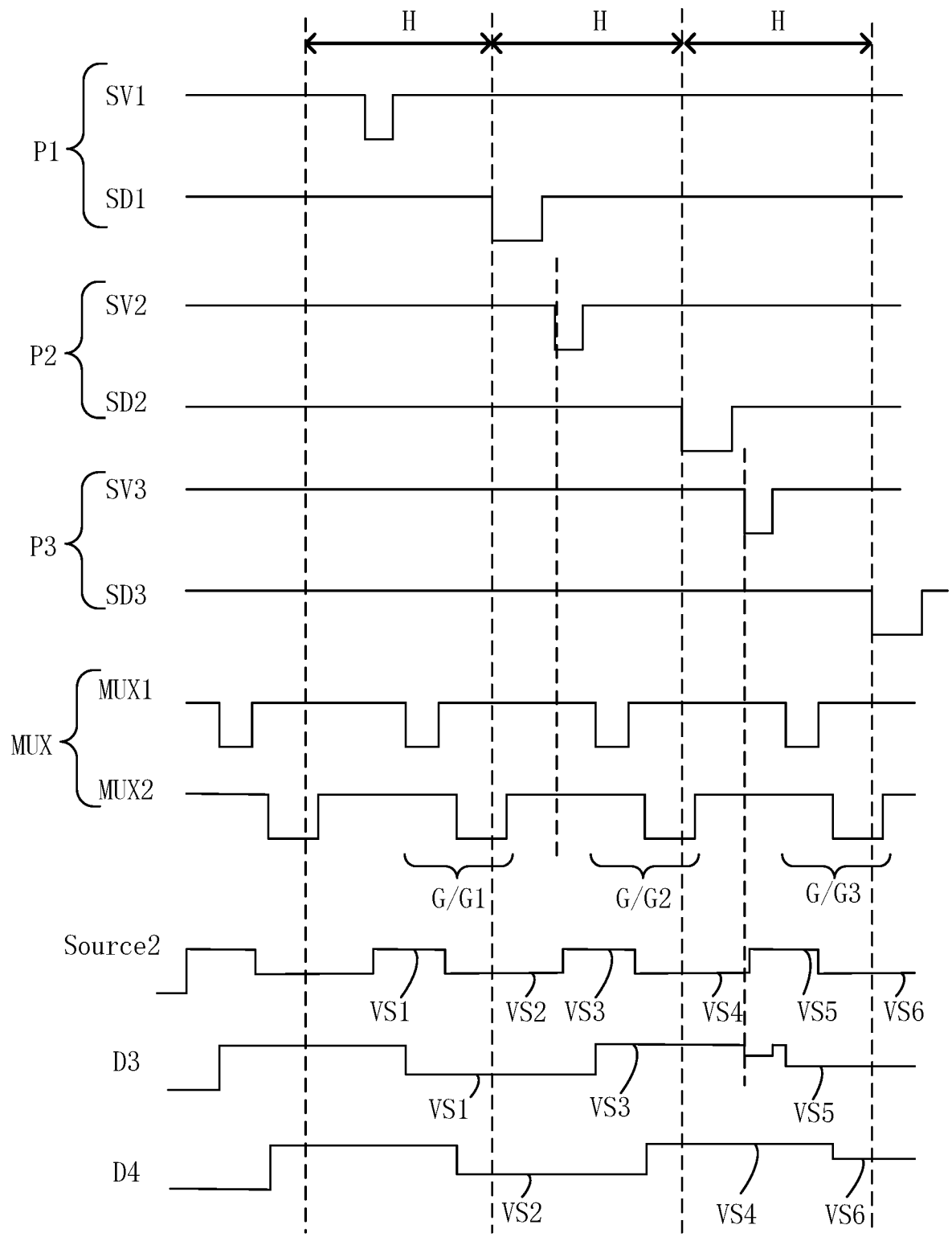
FIG. 23 is another drive timing graph of a display panel according to an embodiment of the present disclosure.

FIG. 23 is another drive timing graph of a display panel according to an embodiment of the present disclosure. Referring to FIG. 23, the first voltage edge of the enable level of the (N+i+1)-th reset control signal SV(N+i+1) is after the second voltage edge of the enable level of the last gating control signal MUX arranged in chronological order in the N-th gating control signal group G(N).

For example, with continued reference to FIG. 23, the display panel includes two gating control lines MUXL, the enable level is the low level, the first voltage edge is the falling edge, and the second voltage edge is the rising edge. When i=0 and N=1, the falling edge of the second reset control signal SV2 is after the rising edge of the first write control signal SD1, and the first gating control signal group G1 is before the rising edge of the first write control signal SD1 so that the falling edge of the second reset control signal SV2 is after a rising edge of the second gating control signal MUX2 in the first gating control signal group G1. Similarly, when i=0 and N=2, the falling edge of the third reset control signal SV3 is after the rising edge of the second gating control signal MUX2 in the second gating control signal group G2. When the (N+1)-th data signal D(N+1) changes due to an effect of the first voltage edge of the enable level of the (N+1)-th reset control signal SV(N+1), the N-th gating control signal group G(N) has completed the process of writing the source signal into the data line DL, and the N-th row of pixel circuits P(N) has completed the writing process of the data signals on the data lines DL. Thus, an effect of the first voltage edge of the enable level of the (N+1)-th reset control signal SV(N+1) on the process of writing the source signal into the data line DL through the N-th gating control signal group G(N) and the process of writing the data signals to the N-th row of pixel circuits P(N) can be reduced, thereby improving the accuracy of the data signals during the writing of the data signals to the N-th row of pixel circuits P(N).

Figure 24:
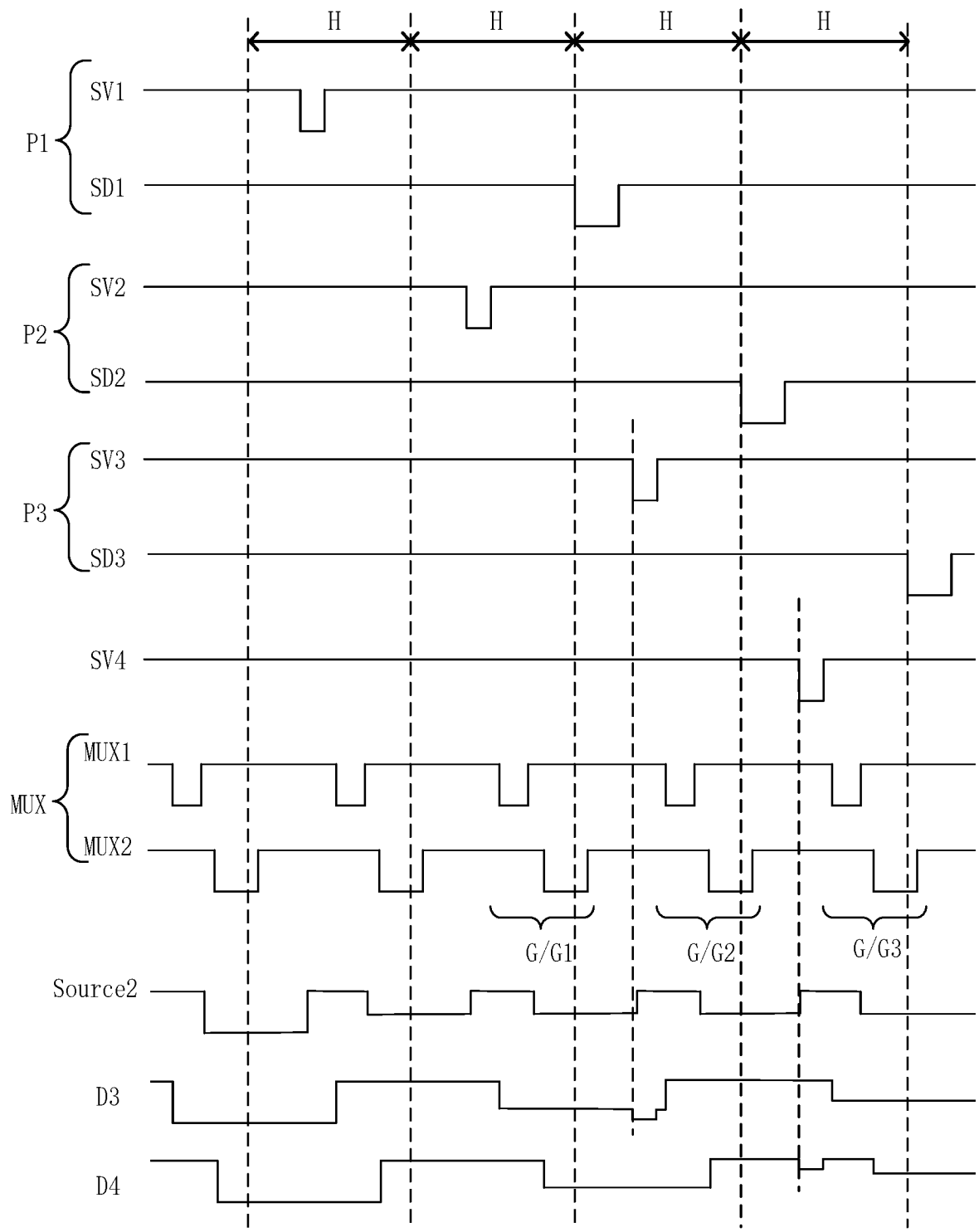
FIG. 24 is another drive timing graph of a display panel according to an embodiment of the present disclosure.

FIG. 24 is another drive timing graph of a display panel according to an embodiment of the present disclosure. Referring to FIG. 24, when i=1 and N=1, the falling edge of the third reset control signal SV3 is after the rising edge of the first write control signal SD1, and the first gating control signal group G1 is before the rising edge of the first write control signal SD1 so that the falling edge of the third reset control signal SV3 is after the rising edge of the second gating control signal MUX2 in the first gating control signal group G1. Similarly, when i=1 and N=2, the falling edge of the fourth reset control signal SV4 is after the rising edge of the second gating control signal MUX2 in the second gating control signal group G2. In this manner, an effect of the first voltage edge of the enable level of the (N+2)-th reset control signal SV(N+2) on the process of writing the source signal into the data line DL through the N-th gating control signal group G(N) and the process of writing the data signals to the N-th row of pixel circuits P(N) can be reduced.

Optionally, a time length between first voltage edges of enable levels of two adjacent write control signals is the unit duration H, and the same unit duration H includes the enable level of the N-th write control signal SD(N) and at least part of a period of the enable level of the (N+i+1)-th reset control signal SV(N+i+1).

For example, the enable level is the low level. Referring to FIG. 23, when i=0, the enable level of the (N+1)-th reset control signal SV(N+1) and the enable level of the N-th write control signal SD(N) are within the same unit duration H, and the enable level of the (N+1)-th reset control signal SV(N+1) and the enable level of the N-th write control signal SD(N) differ by 0 unit durations H (where the same unit duration H is considered as a difference of 0 unit durations H). Referring to FIG. 24, when i=1, the enable level of the (N+2)-th reset control signal SV(N+2) and the enable level of the N-th write control signal SD(N) are within the same unit duration H, and the enable level of the (N+1)-th reset control signal SV(N+1) and the enable level of the N-th write control signal SD(N) differ by 1 unit duration H (where adjacent unit durations H are considered as a difference of 1 unit duration H). In contrast to that in FIG. 23, the reset control signal in FIG. 24 is moved forward by one unit duration H. It is to be understood that the reset control signal in FIG. 23 may be moved forward by i unit durations H, and i may be other integers, which are not repeated one by one in the embodiments of the present disclosure.

With the reset control signal in FIG. 23 as a reference value, the reset control signal cannot be moved backward based on the reference value. Otherwise, the (N+i+1)-th reset control signal SV(N+i+1) affects the process of writing the data signal to the (N+1)-th row of pixel circuits P(N) corresponding to the (N+1)-th write control signal SD(N+1). However, the reset control signal may be moved forward by i unit durations H based on the reference value, where i is a natural number. In this case, the enable level of the (N+i+1)-th reset control signal SV(N+i+1) and the enable level of the N-th write control signal SD(N) are within the same unit duration H.

The time length between the first voltage edges of the enable levels of two adjacent write control signals is designed to be the unit duration H, and at least part of the period of the enable level of the (N+i+1)-th reset control signal SV(N+i+1) and the enable level of the N-th write control signal SD(N) are within the same unit duration H so that on the premise that the first voltage edge and/or the second voltage edge of the enable level of the (N+i+1)-th reset control signal do not overlap the enable level of the N-th write control signal SD(N), the enable level of the reset control signal can be moved forward by i unit durations H based on the reference value, where the value of i may be set according to actual requirements. For the same row of pixel circuits 01, the drive transistor is always at a reset stage within and after the period of the enable level of the reset control signal and before the enable level of the write control signal so that the setting of a reset time of the drive transistor is facilitated, that is, the setting of a time period for threshold compensation and characteristic recovery of the drive transistor is facilitated. The reset time may be prolonged appropriately, which is conducive to adjusting a characteristic of the drive transistor to an initial state, thereby reducing a smear due to a failure to well recover the characteristic of the drive transistor and facilitating the improvement of the overall display effect of the display panel.

In other optional embodiments, the unit duration H may be a time length between second voltage edges of the enable levels of two adjacent write control signals, a time length between first voltage edges of enable levels of two adjacent reset control signals, or a time length between second voltage edges of enable levels of two adjacent reset control signals. Similarly, in this manner, at least part of the period of the enable level of the (N+i+1)-th reset control signal and at least part of a period of the enable level of the N-th write control signal can be within the same unit duration H, and the enable level of the reset control signal may be moved forward by i unit durations H based on the reference value, which are not repeated one by one in the embodiments of the present disclosure.

It is to be noted that the timing of the display panel provided in the embodiments of the present disclosure further includes a light emission control signal electrically connected to each row of pixel circuits, the light emission control signal is always at the disable level at a gate reset stage and a data signal write stage of the drive transistor in the pixel circuit, and the light emission control signal hardly affects the potential of the data signal at the data signal write stage so that for the same row of pixel circuits, the light emission control signal is not limited in the embodiments of the present disclosure as long as the light emission control signal satisfies the disable level at the gate reset stage and the data signal write stage. The light emission control signal is no longer described in the embodiments of the present disclosure.

Figure 25:
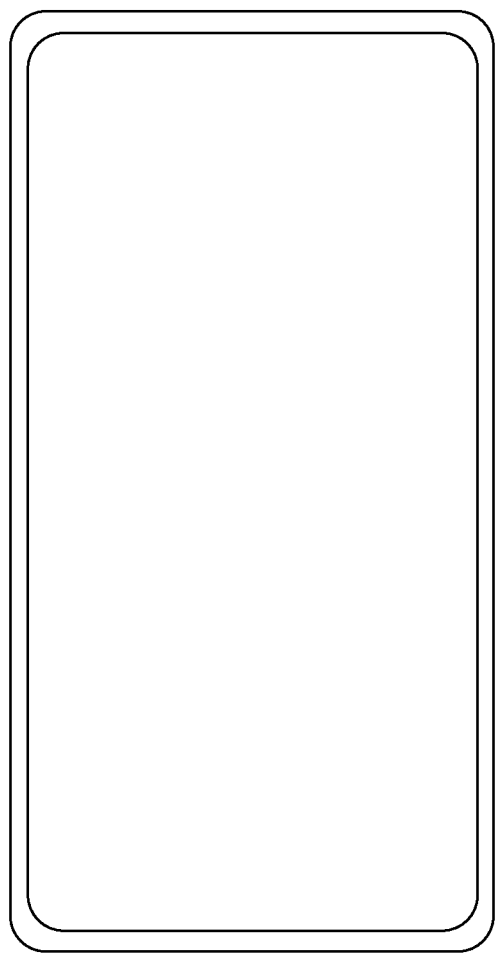
FIG. 25 is a top view of a display device according to an embodiment of the present disclosure.

Based on the same inventive concept, the embodiments of the present disclosure further provide a display device. FIG. 25 is a top view of a display device according to an embodiment of the present disclosure. The display device includes the display panel according to any embodiment of the present disclosure. The display device provided in the embodiments of the present disclosure may be a phone shown in FIG. 25 or may be any electronic product having a display function, including, but not limited to, a television, a laptop, a desktop display, a tablet computer, a digital camera, a smart bracelet, smart glasses, a vehicle-mounted display, a medical device, an industrial control device, and a touch interactive terminal. No special limitations are made thereto in the embodiments of the present disclosure.

It is to be noted that the preceding are only preferred embodiments of the present disclosure and the technical principles used therein. It is to be understood by those skilled in the art that the present disclosure is not limited to the embodiments described herein. For those skilled in the art, various apparent modifications, adaptations, and substitutions can be made without departing from the scope of the present disclosure. Therefore, although the present disclosure has been described in detail through the preceding embodiments, the present disclosure is not limited to the preceding embodiments and may include other equivalent embodiments without departing from the concept of the present disclosure. The scope of the present disclosure is determined by the scope of the appended claims.

What is claimed is:

1. A display panel, comprising a display region, wherein the display region comprises:
   a plurality of pixel circuits arranged in an array along a first direction and a second direction and arranged in rows along the first direction, wherein each of the plurality of pixel circuits comprises a drive transistor, a data write transistor, and a first reset transistor, a first terminal of the data write transistor is coupled to a first terminal of the drive transistor, and a first terminal of the first reset transistor is coupled to a gate of the drive transistor;
   a plurality of signal write control lines and a plurality of reset control lines arranged along the second direction, wherein a signal write control line of the plurality of signal write control lines is coupled to a gate of the data write transistor, and a reset control line of the plurality of reset control lines is coupled to a gate of the first reset transistor;
   a plurality of data lines arranged along the first direction, wherein a data line of the plurality of data lines is coupled to a second terminal of the data write transistor; and a plurality of connection wires, wherein each of the plurality of connection wires comprises a first connection wire segment extending along the first direction and a second connection wire segment extending along the second direction, and the first connection wire segment is electrically connected to the data line;

wherein a reset control signal provided for an (N+i+1)-th row of pixel circuits is denoted as an (N+i+1)-th reset control signal, and a write control signal provided for an N-th row of pixel circuits is denoted as an N-th write control signal, wherein at least one of the following is satisfied: a first voltage edge of an enable level of the (N+i+1)-th reset control signal does not overlap an enable level of the N-th write control signal, or a second voltage edge of an enable level of the (N+i+1)-th reset control signal does not overlap an enable level of the N-th write control signal;

wherein in an enable level of a same reset control signal, the second voltage edge is after the first voltage edge, N is a positive integer, and i is a natural number; and wherein the second voltage edge of the enable level of the (N+i+1)-th reset control signal is after the enable level of the N-th write control signal.

2. The display panel of claim 1, wherein the first voltage edge of the enable level of the (N+i+1)-th reset control signal is after the enable level of the N-th write control signal.

3. The display panel of claim 1, wherein the first voltage edge of the enable level of the (N+i+1)-th reset control signal is before the enable level of the N-th write control signal.

4. The display panel of claim 3, wherein a time interval between the first voltage edge of the enable level of the (N+i+1)-th reset control signal and a first voltage edge of the enable level of the N-th write control signal is greater than a first threshold.

5. The display panel of claim 1, wherein a write control signal provided for an (N+1)-th row of pixel circuits is denoted as an (N+1)-th write control signal;

wherein the second voltage edge of the enable level of the (N+i+1)-th reset control signal is before an enable level of the (N+1)-th write control signal.

6. The display panel of claim 5, wherein a time interval between the second voltage edge of the enable level of the (N+i+1)-th reset control signal and a first voltage edge of the enable level of the (N+1)-th write control signal is greater than a second threshold.

7. The display panel of claim 1, wherein a write control signal provided for an (N−1)-th row of pixel circuits is denoted as an (N−1)-th write control signal, wherein N is greater than 1;

wherein the first voltage edge of the enable level of the (N+i+1)-th reset control signal is after an enable level of the (N−1)-th write control signal.

8. The display panel of claim 1, wherein the data line provides a data signal; and one period in which the data signal is located coincides with one period in which an enable level of a write control signal is located.

9. The display panel of claim 1, wherein at least part of a period of the enable level of the (N+i+1)-th reset control signal and the enable level of the N-th write control signal are within a same unit duration;

wherein the unit duration is equal to a time length between first voltage edges of enable levels of two adjacent write control signals.

10. A display device, comprising a display panel according to claim 1.

11. The display device of claim 10, wherein the first voltage edge of the enable level of the (N+i+1)-th reset control signal is after the enable level of the N-th write control signal.

12. The display device of claim 10, wherein the first voltage edge of the enable level of the (N+i+1)-th reset control signal is before the enable level of the N-th write control signal.

13. A display panel, comprising a display region, wherein the display region comprises:

a plurality of pixel circuits arranged in an array along a first direction and a second direction and arranged in rows along the first direction, wherein each of the plurality of pixel circuits comprises a drive transistor, a data write transistor, and a first reset transistor, a first terminal of the data write transistor is coupled to a first terminal of the drive transistor, and a first terminal of the first reset transistor is coupled to a gate of the drive transistor;

a plurality of signal write control lines and a plurality of reset control lines arranged along the second direction, wherein a signal write control line of the plurality of signal write control lines is coupled to a gate of the data write transistor, and a reset control line of the plurality of reset control lines is coupled to a gate of the first reset transistor;

a plurality of data lines arranged along the first direction, wherein a data line of the plurality of data lines is coupled to a second terminal of the data write transistor; and a plurality of connection wires, wherein each of the plurality of connection wires comprises a first connection wire segment extending along the first direction and a second connection wire segment extending along the second direction, and the first connection wire segment is electrically connected to the data line;

wherein a reset control signal provided for an (N+i+1)-th row of pixel circuits is denoted as an (N+i+1)-th reset control signal, and a write control signal provided for an N-th row of pixel circuits is denoted as an N-th write control signal, wherein at least one of the following is satisfied: a first voltage edge of an enable level of the (N+i+1)-th reset control signal does not overlap an enable level of the N-th write control signal, or a second voltage edge of an enable level of the (N+i+1)-th reset control signal does not overlap an enable level of the N-th write control signal;

wherein in an enable level of a same reset control signal, the second voltage edge is after the first voltage edge, N is a positive integer, and i is a natural number; and wherein the display panel further comprises gating units and at least two gating control lines, wherein output terminals of the gating units are electrically connected to the plurality of data lines, and control terminals of the gating units are electrically connected to the at least two gating control lines;

the at least two gating control lines are configured to provide gating control signals to a gating unit of the gating units, the gating unit, under control of an enable level of one of the gating control signals transmitted by the at least two gating control lines, makes an input terminal of the gating unit connected to and conducted with one of a plurality of output terminals of the gating unit, and enable levels of the gating control signals transmitted by the at least two gating control lines constitute a gating control signal group;
- a gating control signal group provided for the N-th row of pixel circuits is denoted as an N-th gating control signal group, and the N-th gating control signal group is before a second voltage edge of the enable level of the N-th write control signal; and
- the first voltage edge of the enable level of the (N+i+1)-th reset control signal is before a second voltage edge of an enable level of a last gating control signal arranged in chronological order in the N-th gating control signal group.

14. The display panel of claim 13, wherein the first voltage edge of the enable level of the (N+i+1)-th reset control signal is before a first voltage edge of an enable level of a first gating control signal arranged in chronological order in the N-th gating control signal group.

15. The display panel of claim 13, wherein a write control signal provided for an (N+1)-th row of pixel circuits is denoted as an (N+1)-th write control signal, and a gating control signal group provided for the (N+1)-th row of pixel circuits is denoted as an (N+1)-th gating control signal group;
- wherein the second voltage edge of the enable level of the (N+i+1)-th reset control signal is after the enable level of the N-th write control signal and before the (N+1)-th gating control signal group.

16. The display panel of claim 13, wherein at least two gating control signals comprise a first gating control signal and a second gating control signal, and in a same gating control signal group, an enable level of the first gating control signal is before an enable level of the second gating control signal;
- if N+i+1 is an odd number, the following is satisfied that the first voltage edge of the enable level of the (N+i+1)-th reset control signal is before a first voltage edge of the enable level of the first gating control signal in the N-th gating control signal group; and
- if N+i+1 is an even number, the following is satisfied that the first voltage edge of the enable level of the (N+i+1)-th reset control signal is between the enable level of the first gating control signal and the enable level of the second gating control signal in the N-th gating control signal group.

17. The display panel of claim 13, wherein the gating unit comprises a first gating transistor and a second gating transistor, and the at least two gating control lines comprise a first gating control line and a second gating control line;
- a first terminal of the first gating transistor is electrically connected to a first terminal of the second gating transistor, a second terminal of the first gating transistor is electrically connected to an odd data line, and a gate of the first gating transistor is electrically connected to the first gating control line; and
- a second terminal of the second gating transistor is electrically connected to an even data line, and a gate of the second gating transistor is electrically connected to the second gating control line.

18. A display device, comprising a display panel according to claim 13.

19. A display panel, comprising a display region, wherein the display region comprises:
- a plurality of pixel circuits arranged in an array along a first direction and a second direction and arranged in rows along the first direction, wherein each of the plurality of pixel circuits comprises a drive transistor, a data write transistor, and a first reset transistor, a first terminal of the data write transistor is coupled to a first terminal of the drive transistor, and a first terminal of the first reset transistor is coupled to a gate of the drive transistor;
- a plurality of signal write control lines and a plurality of reset control lines arranged along the second direction, wherein a signal write control line of the plurality of signal write control lines is coupled to a gate of the data write transistor, and a reset control line of the plurality of reset control lines is coupled to a gate of the first reset transistor;
- a plurality of data lines arranged along the first direction, wherein a data line of the plurality of data lines is coupled to a second terminal of the data write transistor; and
- a plurality of connection wires, wherein each of the plurality of connection wires comprises a first connection wire segment extending along the first direction and a second connection wire segment extending along the second direction, and the first connection wire segment is electrically connected to the data line;
- wherein a reset control signal provided for an (N+i+1)-th row of pixel circuits is denoted as an (N+i+1)-th reset control signal, and a write control signal provided for an N-th row of pixel circuits is denoted as an N-th write control signal, wherein at least one of the following is satisfied: a first voltage edge of an enable level of the (N+i+1)-th reset control signal does not overlap an enable level of the N-th write control signal, or a second voltage edge of an enable level of the (N+i+1)-th reset control signal does not overlap an enable level of the N-th write control signal;
- wherein in an enable level of a same reset control signal, the second voltage edge is after the first voltage edge, N is a positive integer, and i is a natural number; and
- wherein the display region comprises a plurality of row display regions arranged along the second direction, and each of the plurality of row display regions comprises one row of pixel circuits; and
- in a same row display region, the reset control line is disposed between the first connection wire segment and the signal write control line along the second direction.

20. A display device, comprising a display panel according to claim 19.

* * * * *